United States Patent [19]
Suzuki et al.

[11] Patent Number: 5,350,459
[45] Date of Patent: Sep. 27, 1994

[54] ORGANIC PHOTOVOLTAIC ELEMENT

[75] Inventors: Tetsuro Suzuki; Masao Yoshikawa, both of Yokohama; Kazukiyo Nagai; Hiroshi Ikuno, both of Numazu, all of Japan

[73] Assignee: Ricoh Company, Ltd., Tokyo, Japan

[21] Appl. No.: 54,199

[22] Filed: Apr. 30, 1993

[30] Foreign Application Priority Data

May 1, 1992 [JP] Japan .................................. 4-112704

[51] Int. Cl.$^5$ .................. H01L 31/06; H01L 31/0344
[52] U.S. Cl. ..................................... 136/263; 257/40; 257/184; 257/461
[58] Field of Search ................. 136/263; 257/40, 184, 257/431, 461

[56] References Cited

U.S. PATENT DOCUMENTS 5,201,963  4/1993  Yoshikawa et al. ................ 136/263

FOREIGN PATENT DOCUMENTS 4-10576  1/1992  Japan .................................. 136/263

*Primary Examiner*—Aaron Weisstuch
*Attorney, Agent, or Firm*—Oblon, Spivak, McClelland, Maier & Neustadt

[57] ABSTRACT

An organic photovoltaic element is composed of a first electrode, a first electron acceptor organic layer provided on the first electrode, a second electron acceptor organic layer which is different from the first electron acceptor organic layer, provided on the first electron acceptor organic layer, a first electron donor organic layer provided on the second electron acceptor organic layer, a second electron acceptor organic layer which is different from the first electron acceptor organic layer, provided on the first electron acceptor organic layer, and a second electrode provided on the second electron acceptor organic layer, at least one of the first electrode or the second electrode being transparent.

6 Claims, 1 Drawing Sheet

ORGANIC PHOTOVOLTAIC ELEMENT

BACKGROUND OF THE INVENTION

1. Field of the Invention

The present relates to an organic photovoltaic element such as a solar battery, which can be applied to an optical sensor and the like.

2. Discussion of Background

Many organic photovoltaic elements using as an active material an organic material have been studied in order to develop an organic photovoltaic element which is inexpensive and free from toxicity. This is because it is extremely difficult to develop such an organic photovoltaic element by use of single crystalline silicon, polycrystalline silicon, or amorphous silicon.

A photovoltaic element is an element which can convert light energy to electrical energy (voltage x current). Therefore the photovoltaic element is evaluated mainly by the conversion efficiency of light energy to electrical energy. An internal electric field must exist for the generation of photocurrent. Several elements with particular structures for generating such an internal electric field have already been known. The optimum conversion efficiencies of the conventionally known elements, obtained by use of organic materials as the active material, are as follows:

(1) Schottky junction or MIS type junction:

In this junction, an internal electric field generated at a metal/semiconductor junction is utilized. As organic semiconductor materials for the above junction, for instance, merocyanine dyes and phthalocyanine dyes have been reported. For instance, in the case of an Al/merocyanine dye/Ag element, the conversion efficiency is 0.7% ($V_{OC}=1.2$ V, $J_{SC}=1.8$ mA/cm$^2$, ff=0.25) with the irradiation of a white light of 78 mW/cm$^2$ (A. K. Ghosh et al., J. Appl. Phys. 49, 5982 (1978)). Organic semiconductors which are employed in this type of photovoltaic element and have high conversion efficiencies are limited to p-type organic semiconductors. Therefore, materials employed for the electrodes are limited to those with a low work function, such as Al, In, and Mg. These materials, however, have the drawback that they are easily oxidized.

(2) Hetero p-n junction utilizing an n-type inorganic semiconductor/p-type organic semiconductor junction:

In this junction, an internal electric field generated at an n-type inorganic semiconductor/p-type organic semiconductor junction is utilized. As the n-type inorganic semiconductor, for instance, CdS and ZnO are employed, and as the p-type organic semiconductor, for instance, merocyanine dyes and phthalocyanine dyes have been reported as being usable.

An optimum conversion efficiency obtained so far is 0.22% ($V_{oc}=0.69$ V, $J_{sc}=0.89$ mA/cm$^2$, ff=0.29) by use of an ITO/electrodeposited CdS/chlorinated aluminum chlorophthalocyanine/Au element with an AM-2 irradiation of 75 mW/cm$^2$ (A. Hor et al., Appl. Phys. Lett., 42, 15(1983)).

(3) Organic/organic hetero p-n junction:

In this junction, an internal electric field generated by the junction of an organic electron acceptor material and an organic electron donor material is utilized.

Examples of such an organic electron acceptor material are dyes such as Malachite Green, Methyl Violet, pyrylium compounds, and fused polycyclic aromatic compounds such as flavanthrone, and perylene pigments.

It is reported that the conversion efficiency of an ITO/copper phthalocyanine/perylene pigment/Ag element was 0.95% ($V_{oc}=0.45$ V, $J_{sc}=2.3$ mA/cm$^2$, ff=0.65) with an AM-2 irradiation of 75 mW/cm$^2$ (C. Tang. Appl. Phys. Lett., 48, 183 (1986)). This value of the conversion efficiency is the largest obtained by an organic photovoltaic element using an organic material. In Japanese Patent Publication 62-4871 in the name of C. Tang, it is reported that a conversion efficiency of 1.0% ($V_{oc}=0.44$ V, $J_{sc}=3.2$ mA/cm$^2$, ff=0.6) was obtained when a perylene pigment different from the above-mentioned perylene pigment was employed in a photovoltaic element with the same structure as mentioned above.

Generally the conversion efficiency of organic photovoltaic elements is lower than that of inorganic photovoltaic elements. The most significant factor for this difference is that organic photovoltaic elements have a low short-circuit photocurrent ($J_{sc}$). At least a short-circuit photocurrent ($J_{sc}$) of 10 mA/cm$^2$ is necessary for a photovoltaic element with a conversion efficiency of 5%, with a white light irradiation of 75 mW/cm$^2$. However, the photocurrent ($J_{sc}$) of any of the above-mentioned organic photovoltaic elements is much lower than 10 mA/cm$^2$. This is caused by the low quantum efficiency of the organic photovoltaic elements and by the narrowness of the wavelength range of spectral sensitivity thereof. It is desirable that the wavelength range of spectral sensitivity be extended from 400 nm to a larger range as much as possible. However, the conventional organic photovoltaic elements mentioned above have a very limited wavelength range of spectral sensitivity.

Furthermore, many conventional organic photovoltaic elements have a small ff value. It is said that one of the reasons for the small ff value is that the quantum efficiency of any of the organic semiconductors employed therein is rapidly decreased in a low electric field. Therefore, it is preferable to employ an organic photovoltaic element having such a structure as to generate an internal electric field with high intensity in order not to decrease the quantum efficiency of the organic semiconductor employed therein. Furthermore, a photovoltaic element having a structure that can cause generated electric charges to smoothly reach the electrodes without energy barriers increases the ff value. If these can be attained, the value of $V_{oc}$ can be increased, but the above-mentioned factors are not taken into consideration in many conventional organic photovoltaic elements.

In addition, many conventional organic photovoltaic elements have problems with respect to the chemical stability of the materials employed for electrodes.

From this point of view, the following conventional organic photovoltaic elements will now be explained.

(1) Schottky junction or MIS junction:

In this junction, a large value of $V_{oc}$ can be obtained. However, since metallic materials are used for the electrodes, the light transmittance of the electrodes is low. The light transmittance obtained in practice is 30% at best, usually about 10%. Furthermore, the metallic materials used for the electrodes are poor in resistance to oxidation. Therefore, it is not expected to fabricate an organic photovoltaic element with high conversion efficiency and stable characteristics by use of a Schottky junction or a MIS junction.

(2) Inorganic semiconductor/organic semiconductor hetero p-n junction:

Electric charges are mainly generated in the organic layer, so that a photovoltaic element using this junction is restricted with respect to the spectral sensitivity thereof. Usually, the organic layer in the photovoltaic element is composed of one organic semiconductor. However, there are no organic semiconductors with a high light absorption property capable of absorbing light in a wavelength range of, for instance, from 400 nm to 800 nm. A photovoltaic element with the structure using this junction can solve the problems concerning the light transmittance of a light-incident electrode and the stability of the electrodes, but the region of the spectral sensitivity is so narrow that a high conversion efficiency will not be obtained.

(3) Organic/organic hetero p-n junction

This junction is better than the above-mentioned two types of junctions and the most desirable junction obtained at present. Light irradiation can be carried out through a transparent electrode, and photoelectric charges can be generated by use of two organic materials, so that the range of the spectral sensitivity can be expanded. As a matter of fact, according to the previously mentioned Tang's report, perylene pigments can generate electric charges with the irradiation of light having a wavelength of 450 to 550 nm, and copper phthalocyanine can generate electric charges with the irradiation of light having a wavelength of 550 to 700 nm. Furthermore, the ff value obtained by an organic photovoltaic element using this junction is larger than that obtained by other photovoltaic elements. It is considered that this is because the intensity of the internal electric field generated therein is larger than that of the internal electric fields generated in other photovoltaic elements.

However, Tang's photovoltaic element has the following drawbacks:

(1) In his patent, it is described that it is preferable that the organic layer have a thickness of 300 to 500 Å. However, the organic layer is so thin that there is a high probability that pin holes are formed therein. Our experiments demonstrated the occurrence of short-circuits circuits between two electrodes with a relatively high probability, which is considered to be caused by the presence of pin holes in the organic layer. According to C. Tang's paper, the area of the electrodes is 0.1 cm$^2$. However, when the area is increased to 1.0 cm$^2$ or more for use in practice, the improvement of the yield of the photovoltaic element without the defects caused by the pin holes will become a big problem.

(2) C. Tang's invention has a problem in the materials for the electrodes. In his invention, it is necessary that each of the electrodes be in ohmic contact with the respective counterpart organic layer. In C. Tang's previously mentioned paper (Appl. Phys. Lett., 48, 183 (1986)), it is described that when the overlaying order of the organic layers is reversed in the photovoltaic element, the value of $V_{oc}$ is decreased. It is considered that this is caused by impairment of the ohmic contact. On the other hand, in the structure in which the ohmic contact is attained, the stability of the metallic materials for the electrodes becomes a problem because it is necessary that the metallic materials which come into contact with organic electron acceptor materials have a low work function. In C. Tang's Patent, In, Ag, Sn, and Al are given as examples of such metallic materials. However, these materials are easily oxidized.

SUMMARY OF THE INVENTION

It is therefore an object of the present invention to provide an organic photovoltaic element with a high conversion efficiency, comprising electrodes made of highly stable materials, which allows at least the use of an electrode with high transparency on the light incident side thereof.

The above object of the present invention can be achieved by an organic photovoltaic element comprising: a first electrode, a first electron acceptor organic layer provided on the first electrode, a second electron acceptor organic layer which is different from the first electron acceptor organic layer, provided on the first electron acceptor organic layer, a first electron donor organic layer provided on the second electron acceptor organic layer, a second electron acceptor organic layer which is different from the first electron acceptor organic layer, provided on the first electron acceptor organic layer, and a second electrode provided on the second electron acceptor organic layer, at least one of the first electrode or the second electrode being transparent.

In the above organic photovoltaic element, it is preferable that the first electron acceptor organic layer or the second electron donor organic layer have a principal light absorption wavelength region which is different from the principal light absorption wavelength region of the second electron acceptor organic layer or that of the first electron donor organic layer.

Further, it is preferable that the second electron donor organic layer have an ionization potential which is equal to or less than the ionization potential of the first electron donor organic layer.

Further, it is preferable that the first electron acceptor organic layer have an electron-affinity which is equal to or greater than that of the second electron acceptor organic layer.

Furthermore, it is preferable that the first electron acceptor organic layer or the second electron acceptor organic layer comprise a pigment selected from the group consisting of a perylene tetracarboxidiimide pigment, a perylene tetracarboxidiimidazole pigment, an anthraquinone acridone pigment, a polycyclic quinone pigment, and a naphthalene tetracarboxidiimidazole pigment, and it is preferable that the first electron donor organic layer or the second electron donor organic layer comprise a phthalocyanine pigment or a quinacridone pigment.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

An organic photovoltaic element of the present invention comprises a first electrode, a first electron acceptor organic layer provided on the first electrode, a second electron acceptor organic layer which is different from the first electron acceptor organic layer, provided on the first electron acceptor organic layer, a first electron donor organic layer, provided on the second electron acceptor organic layer, a second electron acceptor organic layer which is different from the first electron acceptor organic layer, provided on the first electron acceptor organic layer, and a second electrode provided on the second electron acceptor organic layer, at least one of the first electrode or the second electrode being transparent.

In the present invention, it is preferable that the first electron acceptor organic layer or the second electron donor organic layer have a principal light absorption wavelength region which is different from the principal light absorption wavelength region of the second electron acceptor organic layer or from that of the first electron donor organic layer.

Furthermore, in the present invention, it is preferable that the second electron donor organic layer have an ionization potential which is equal to or less than the ionization potential of the first electron donor organic layer.

Furthermore, in the present invention, it is preferable that the first electron acceptor organic layer have an electron-affinity which is equal to or larger than that of the second electron acceptor organic layer.

In the present invention, a particularly high conversion efficiency can be obtained when the first electron acceptor organic layer or the second electron acceptor organic layer comprises a pigment selected from the group consisting of a perylene tetracarboxidiimide pigment, a perylene tetracarboxidiimidazole pigment, an anthraquinone acridone pigment, a polycyclic quinone pigment, and a naphthalene tetracarboxidiimidazole pigment, and/or when the first electron donor organic layer or the second electron donor organic layer comprises a phthalocyanine pigment or a quinacridone pigment.

Figure 1:
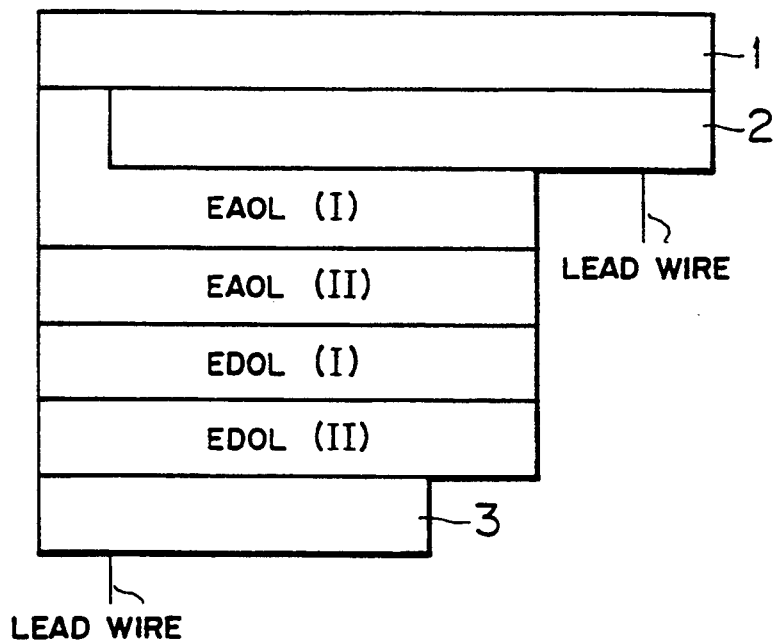
FIG. 1 is a schematic cross-sectional view of an example of an organic photovoltaic element according to the present invention.

FIG. 1 is a schematic cross-sectional view of an example of an organic photovoltaic element according to the present invention. In the figure, reference numeral 1 indicates a transparent insulating support; reference numeral 2, a transparent electrode; reference numeral 3, a back electrode; and symbols EAOL(I), EAOL(II), EDOL(I), and EDOL(II) respectively indicate a first electron acceptor organic layer, a second electron acceptor organic layer, a first electron donor organic layer, and a second electron donor organic layer. The transparent insulating support 1 may be provided on the side of the back electrode 3. Furthermore, the overlaying order of the electron acceptor layers and electron donor layers may be reversed. In this case, the electron acceptor layers and electron donor layers are overlaid in the order of EDOL(II), EDOL(I), EAOL(II), and EAOL(I). However, in the present invention, the structure shown in FIG. 1 is more preferable than the reversed structure.

Figure 2:
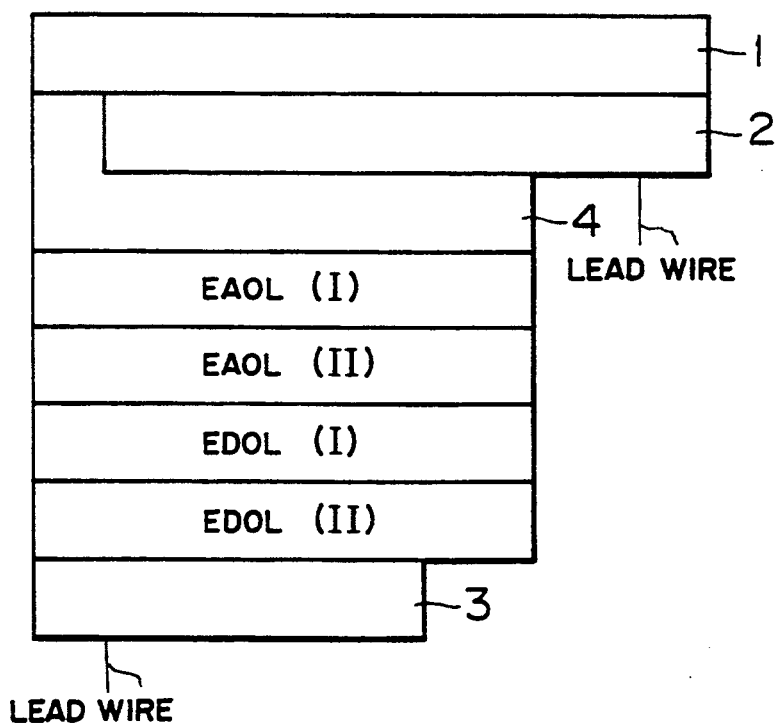
FIG. 2 is a schematic cross-sectional view of another example of an organic photovoltaic element according to the present invention.

FIG. 2 is a schematic cross-sectional view of another example of an organic photovoltaic element according to the present invention. In this figure, the same reference numerals as used in FIG. 1 designate identical layers or parts in the organic photovoltaic element shown in FIG. 1, and reference numeral 4 indicates a transparent n-type inorganic semiconductor layer, which is interposed between the transparent electrode 2 and the first electron acceptor organic layer EAOL(I).

The transparent n-type inorganic semiconductor layer 4 may be provided on the side of the back electrode 3. In this case, it is unnecessary that the n-type inorganic semiconductor layer 4 be transparent. In this example, the overlaying order of the electron acceptor layers and electron donor layers may also be reversed in the same manner as in the organic photovoltaic element shown in FIG. 1. However, in the present invention, the structure shown in FIG. 2 is more preferable than the reversed structure.

As mentioned above, the key feature of the organic photovoltaic element of the present invention is the overlaying of the first electron acceptor organic layer EAOL(I), the second electron acceptor organic layer EAOL(II), the first electron donor organic layer EDOL(I), and the second electron donor organic layer EDOL(II). In this organic photovoltaic element, electric charges are generated at the interface between the second electron acceptor organic layer EAOL(II) and the first electron donor organic layer EDOL(I). The inventors of the present invention have discovered that the above-mentioned structure significantly improves not only the conversion efficiency and stability of the organic photovoltaic element, but also the production reliability when mass produced in comparison with an organic photovoltaic element in which only the second electron acceptor organic layer EAOL(II) and the first electron donor organic layer EDOL(I) are overlaid.

The conversion efficiency ($\eta$) of a photovoltaic element is represented by the following formula:

$$\eta(\%) = \frac{V_{OC} \times J_{SC} \times f\!f}{P_{in}} \times 100$$

where $V_{oc}$ represents the voltage under open circuit, $J_{sc}$ represents the current when short-circuited, ff represents a value indicating a factor of the voltage-current curve under light irradiation, which value is called the "fill factor", and Pin represents incident light energy.

The improvement of the conversion efficiency in the organic photovoltaic element of the present invention is attained by increasing the values of $V_{oc}$, $J_{sc}$, and ff. The reasons for this fact have not yet been clarified, but it is considered that the following factors contribute to the improvement of the conversion efficiency in the present invention:

(a) By providing the first electron acceptor organic layer EAOL(I) and the second electron donor organic layer EDOL(II), each of the second electron acceptor organic layer EAOL (II) and the first electron donor organic layer EDOL(I) can be formed into a thinner film layer in comparison with a structure in which only the second electron acceptor organic layer EAOL (II) and the first electron donor organic layer EDOL(I) are overlaid, and light absorption can be reduced in the portions which have nothing to do with the junction between the second electron acceptor organic layer EAOL (II) and the first electron donor organic layer EDOL(I), and the substantial light absorption in the junction portion can be increased without causing short-circuit phenomenon, whereby the quantum efficiency of the photovoltaic element is improved.

(b) In the structure shown in FIG. 1, by providing the second electron donor organic layer EDOL(II), the formation of pin holes between the second electron acceptor organic layer EAOL(II) and the back electrode 23 can be minimized; and by providing the first electron acceptor organic layer EAOL(I), the formation of pin holes between the first electron donor organic layer EDOL(I) and the transparent electrode 2 can be minimized.

(c) Electrone generated in the second electron acceptor organic layer EAOL(II) are speedily injected into the first electron acceptor organic layer EAOL(I), and positive charges generated in the first electron donor organic layer EDOL(I) are speedily injected into the second electron donor organic layer EDOL(II), so that the recombination of electric charges within the second electron acceptor organic layer (II) and the first electron donor organic layer EDOL(I) is reduced, whereby the quantum efficiency of the photovoltaic element is improved.

(d) By providing the first electron acceptor organic layer EAOL(I) and the second electron donor organic layer EDOL(II), the intensity of the internal electric field, generated at the junction between the second electron acceptor organic layer EAOL(II) and the first electron donor organic layer EDOL(I), is increased. The second electron acceptor organic layer EAOL(II) and the first electron donor organic layer EDOL(I) are charge generation portions. Generally, the generation of electric charges in an organic material depends upon the intensity of the electric field in which the organic material is placed. Therefore, in the present invention, the quantum efficiency is increased as the internal electric field is increased.

Furthermore, according to the present invention, in order to obtain high conversion efficiency, it is preferable that the first electron acceptor organic layer EAOL(I) or the second electron donor organic layer EDOL(II) have a primcipal light absorption wavelength region which is different from the principal light absorption wavelength region of the second acceptor organic layer EAOL(II) or that of the first electron donor organic layer EDOL(I). The reasons for this advantage in the above are considered as follows:

By providing the first electron acceptor organic layer EAOL(I) and the second electron donor organic layer EDOL(II), each of the second electron acceptor organic layer EAOL (II) and the first electron donor organic layer EDOL(I) can be formed into a thinner film layer in comparison with a structure in which only the second electron acceptor organic layer EAOL (II) and the first electron donor organic layer EDOL(I) are overlaid, and light absorption can be reduced in the portions which have nothing to do with the junction between the second electron acceptor organic layer EAOL (II) and the first electron donor organic layer EDOL(I), and the substantial light absorption in the junction portion can be increased, without causing short-circuit phenomena, whereby the quantum efficiency is improved.

However, with respect to the incident light and multiple reflected light from the back electrode 3, the light absorption by the first electron acceptor organic layer EAOL(I) and the second electron donor organic layer EDOL(II) reduces the light which reaches the junction portion between the second electron acceptor organic layer EAOL(II) and the first electron donor organic layer EDOL(I). Therefore, by providing the first electron acceptor organic layer EAOL(I) or the second electron donor organic layer EDOL(II), which has a principal light absorption wavelength region which is different from the principal light absorption wavelength region of the second acceptor organic layer EAOL(II) or that of the first electron donor organic layer EDOL(I), it is possible to minimize the reduction of the light which reaches the junction portion between the second electron acceptor organic layer EAOL(II) and the first electron donor organic layer EDOL(I). Thus, the performance of the organic photovoltaic element can be improved.

In addition to the above, in the present invention, a particular combination of the first electron donor organic layer EDOL(I) and the electron donor organic layer EDOL(II) improves the performance of the organic photovoltaic element of the present invention. A clear, general law has not yet been discovered with respect to the preferable combination, but the ionization potential (Ip) of each of the first electron donor organic layer EDOL(I) and the electron donor organic layer EDOL(II) can be used as one of the key factors. More specifically, it is preferable that the ionization potential (Ip) of the second electron donor organic layer EDOL(II) be the same as or smaller than that of the first electron donor organic layer EDOL(I). The reasons for this are considered as follows: When the ionization potential (Ip) of the second electron donor organic layer EDOL(II) is the same as or smaller than that of the first electron donor organic layer EDOL(I), positive charges generated in the first electron donor organic layer EDOL(I) are injected into the second electron donor organic layer EDOL(II) without any barriers, so that the probability of the recombination of charges in the first electron donor organic layer EDOL(I) is reduced.

Furthermore, in the present invention, a particular combination of the first electron acceptor organic layer EAOL(I) and the electron acceptor organic layer EAOL(II) improves the performance of the organic photovoltaic element of the present invention. A clear, general law has not yet been discovered with respect to the preferable combination of each of the first electron acceptor organic layer EAOL(I) and the electron acceptor organic layer EAOL(II), but the electron affinity (Ea) of each of the first electron acceptor organic layer EAOL(I) and the electron acceptor organic layer EAOL(II) can be used as one of the key factors. More specifically, it is preferable that the electron affinity (Ea) of the first electron acceptor organic layer EAOL(I) be the same as or larger than that of the second electron acceptor organic layer EAOL(II). The reasons for this are considered as follows: When the electron affinity (Ea) of the first electron acceptor organic layer EAOL(I) is the same as or larger than that of the second electron acceptor organic layer EAOL(II), electrons generated in the second electron acceptor organic layer EAOL(II) are injected into the first electron acceptor organic layer EAOL(I) without any barriers, so that the probability of the recombination of charges in the second electron acceptor organic layer EDOL(II) is reduced.

In the present invention, it is preferable that the first electron acceptor organic layer EAOL(I) or the second electron acceptor organic layer EAOL(II) comprise a pigment selected from the group consisting of a perylene tetracarboxidiimide pigment, a perylene tetracarboxidiimidazole pigment, an anthraquinone acridone pigment, a polycyclic quinone pigment, and a naphthalene tetracarboxidiimidazole pigment, and it is preferable that the first electron donor organic layer EDOL(I) or the second electron donor organic layer EDOL(II) comprise a phthalocyanine pigment or a quinacridone pigment.

With respect to the physical properties of the materials required for the first electron acceptor organic layer EAOL(I) and the second electron donor organic layer EDOL(II), it is desired that the materials have an appropriate energy level which does not constitute a barrier against the electron acceptor organic layer EAOL-(II) or the electron donor organic layer(I), and have a low resistivity as organic materials.

Further, with respect to the physical properties of the materials required for the second electron acceptor organic layer EAOL(II) and the first electron donor organic layer EDOL(I), it is desired that the materials are capable of strongly absorbing light in the visible region, have high photoconductivity, an appropriate energy level by which an excellent junction is formed with the first electron donor organic layer EDOL(I) or the second electron acceptor organic layer EAOL(II), a relatively low resistivity as organic materials, and a large electron- or positive-charge-mobility.

However, at present, it is extremely difficult to predict the chemical structure of a material which satisfies the above-mentioned physical properties required for each of the first electron acceptor organic layer EAOL(I), the second electron acceptor organic layer EAOL(II), the first electron donor organic layer EDOL(I), and the second electron donor organic layer EDOL(II). The only way to discover such a material is to test various materials one by one in practice.

The perylene tetracarboxidiimide pigment which is an effective material for the first electron acceptor organic layer EAOL(I) or for the second electron acceptor organic layer EAOL(II) for use in the present invention is represented by the following formula (1):

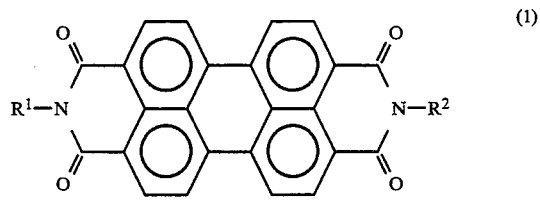
(1)

wherein $R^1$ and $R^2$ each represent hydrogen, an unsubstituted or substituted alkyl group, or an unsubstituted or substituted aryl group.

Specific examples of the perylene tetracarboxidiimide pigment are as follows:

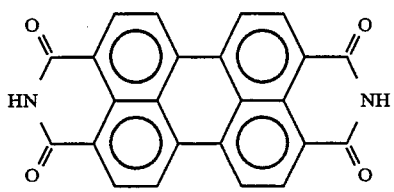
No. A-1

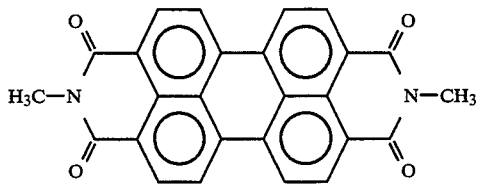
No. A-2

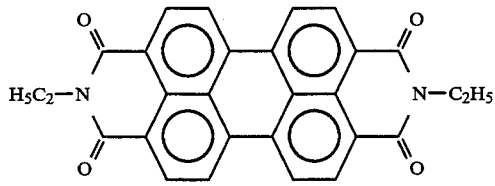
No. A-3

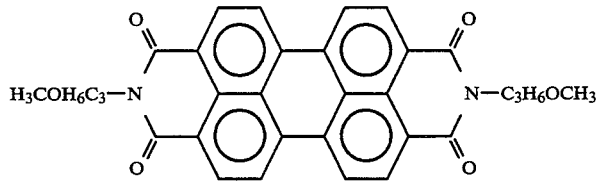
No. A-4

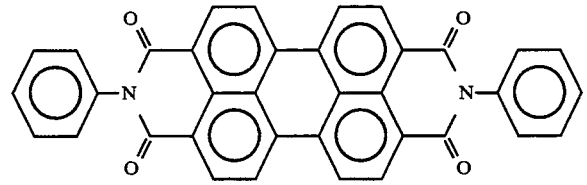
No. A-5

No. A-6

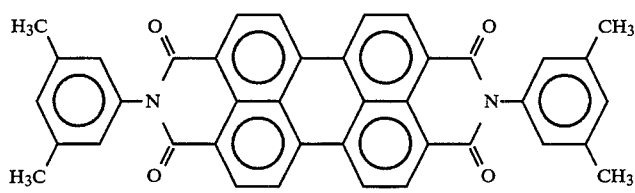

No. A-7

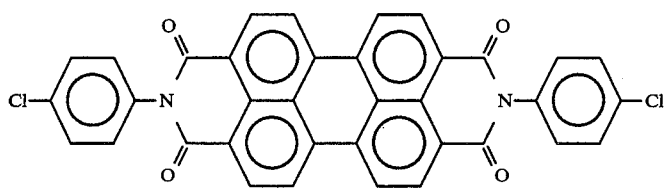

No. A-8

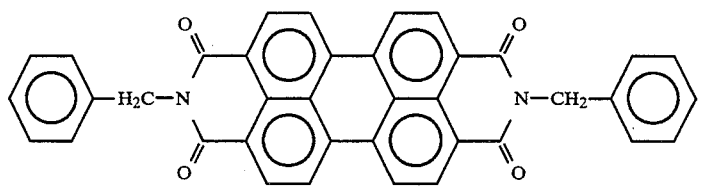

No. A-9

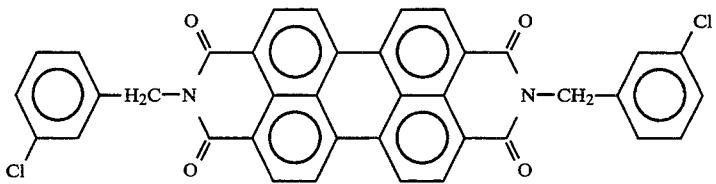

No. A-10

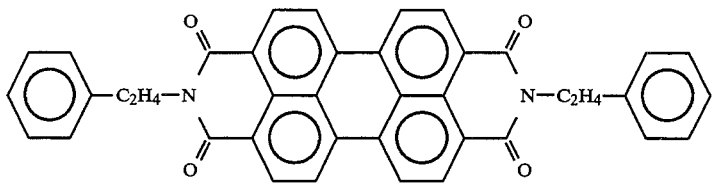

The perylene tetracarboxidiimidazole pigment which is an effective material for the first electron acceptor organic layer EAOL(I) or for the second electron acceptor organic layer EAOL(II) for use in the present invention is represented by the following formulas (2) and (3):

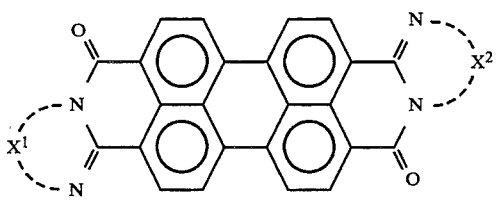 (2)

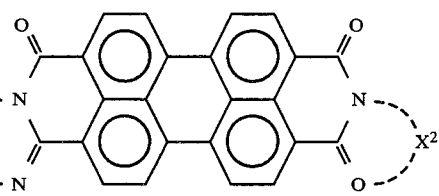 (3)

wherein $X^1$ and $X^2$ each represent an unsubstituted or substituted aryl ring.

Specific examples of the perylene tetracarboxidiimidazole pigment are as follows, in which only transperylene tetracarboxidiimidazole pigments are shown, and cis- and mixtures of cis- and trans-pigments are omitted.

No. B-1

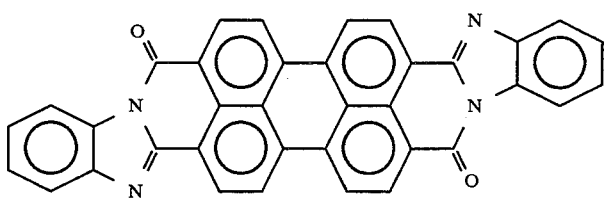

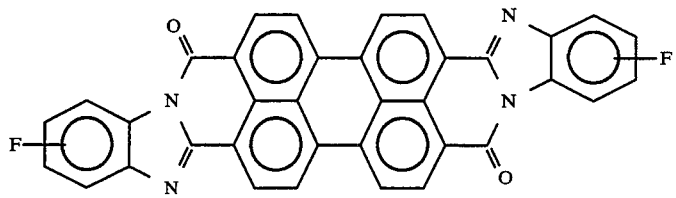
No. B-2
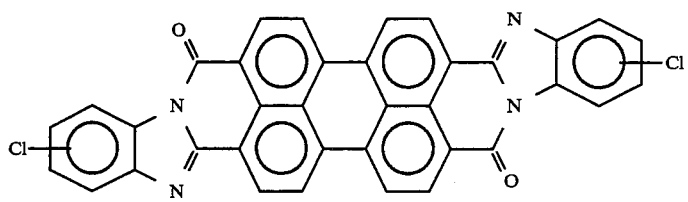
No. B-3
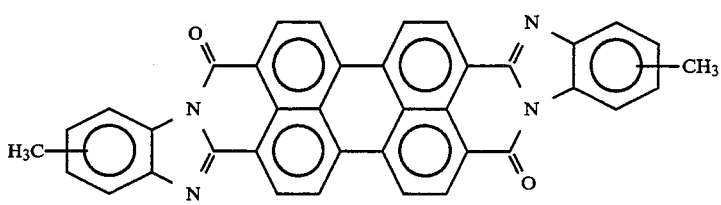
No. B-4
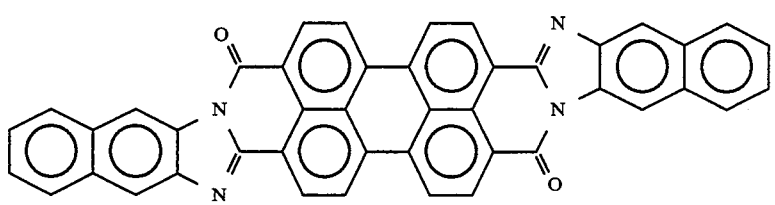
No. B-5
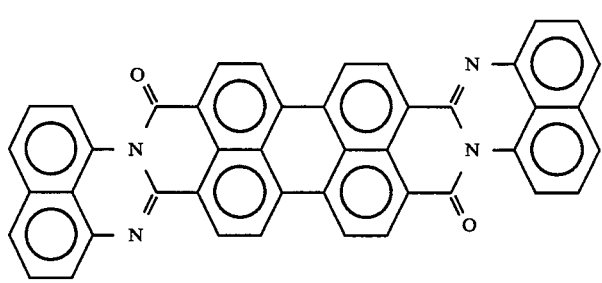
No. B-6
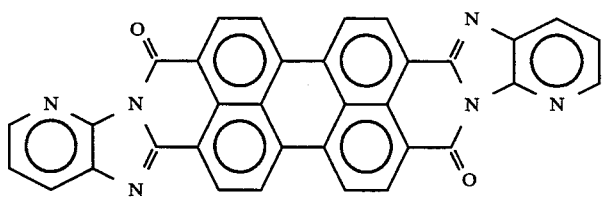
No. B-7
The anthraquinone acridone pigment which is an effective material for the first electron acceptor organic layer EAOL(I) or for the second electron acceptor organic layer EAOL(II) for use in the present invention is represented by the following formulas (4) and (5):
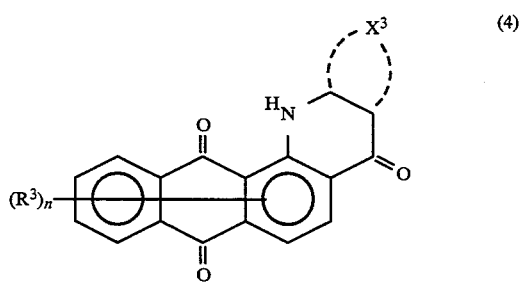
(4)

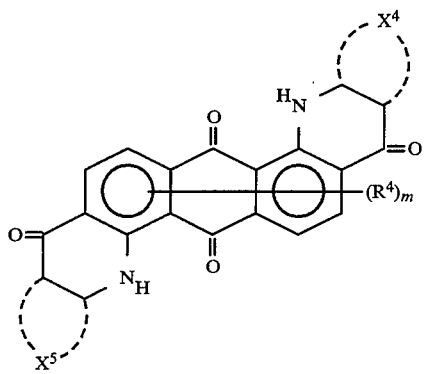
(5)
wherein $X^3$, $X^4$ and $X^5$ each represent an unsubstituted or substituted aryl ring; $R^3$ and $R^4$ each represent a halogen atom; and n and m each represent an integer of 0 to 3.
Specific examples of the anthraquinone acridone pigment of formula (4) are as follows:
No. C-1
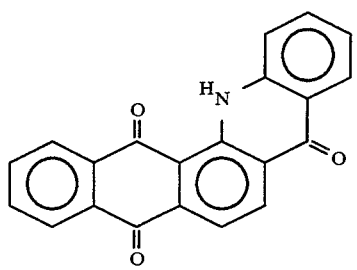
No. C-2
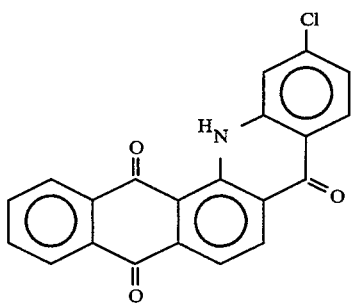
No. C-3
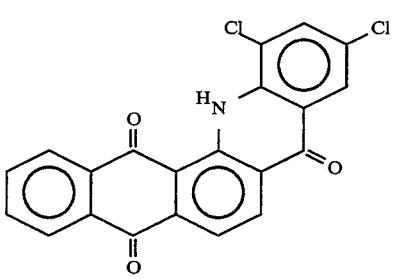
No. C-4
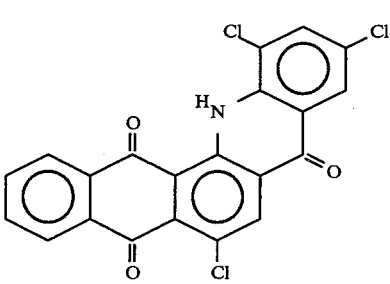
No. C-5
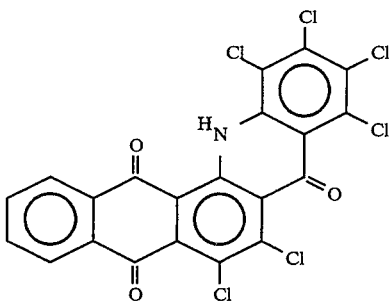
No. C-6
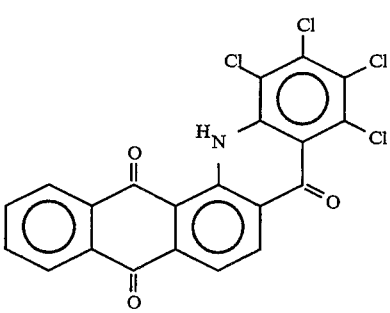
No. C-7
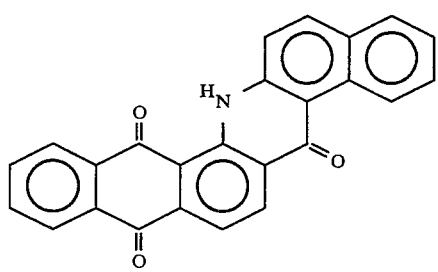
No. C-8
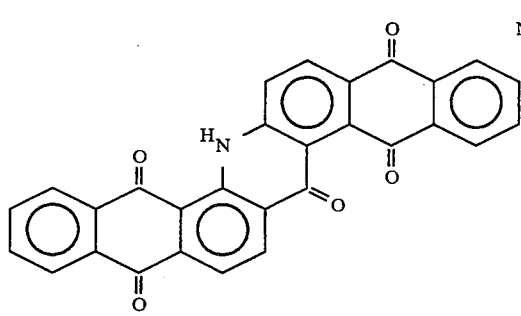
No. C-9
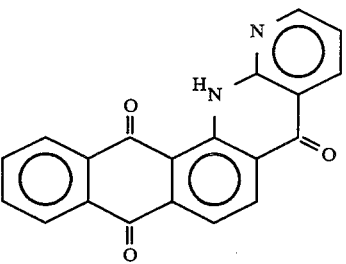

No. C-10
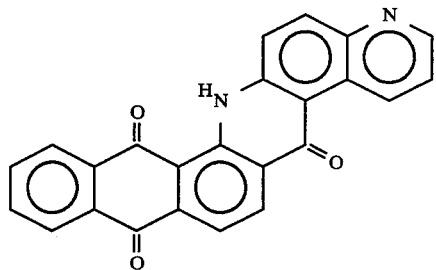
No. C-11
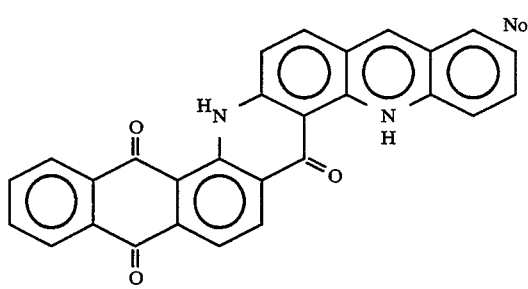
No. C-12
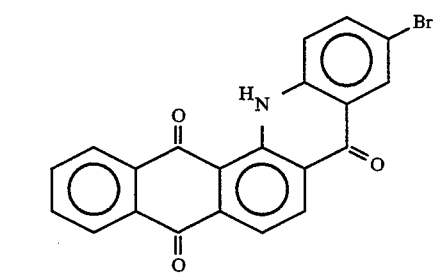
No. C-13
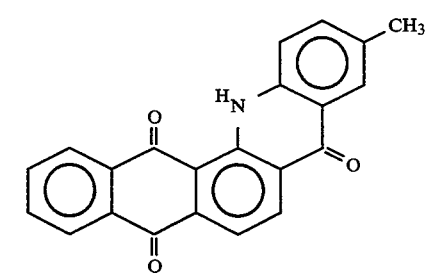
No. C-14
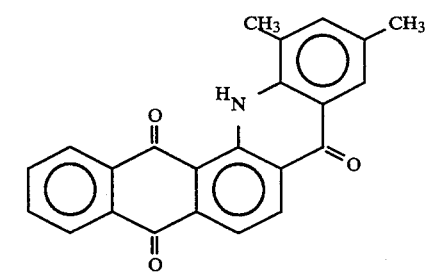
No. C-15
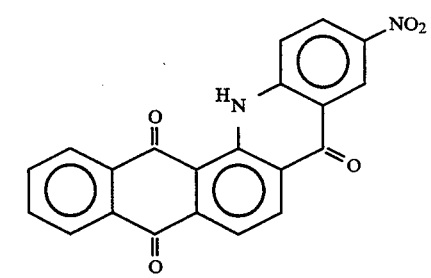
No. C-16
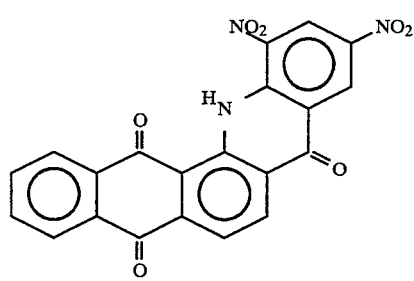
No. C-17
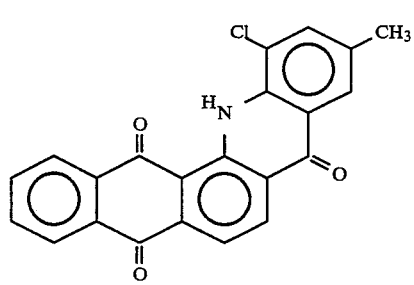
No. C-18
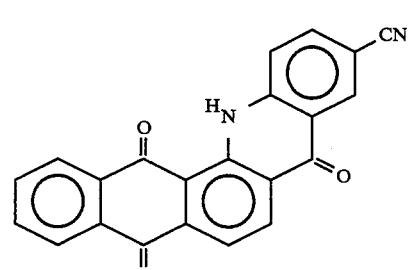
No. C-19
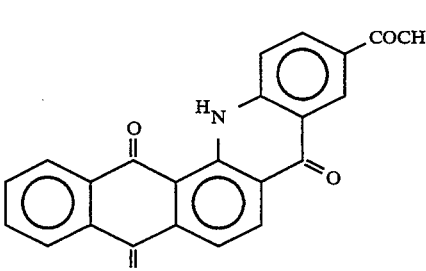
No. C-20
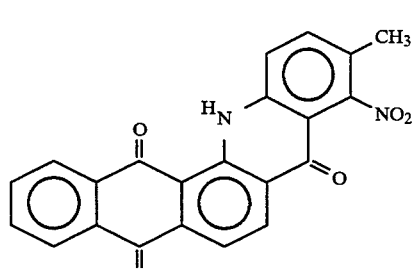
Specific examples of the anthraquinone acridone pigment of formula (5) are as follows:

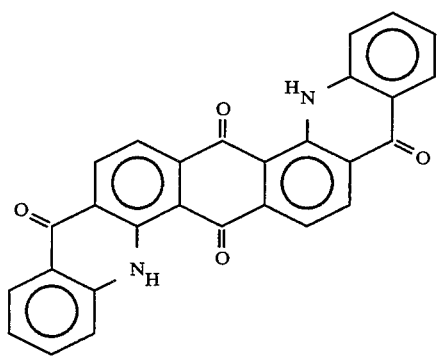
No. C-21
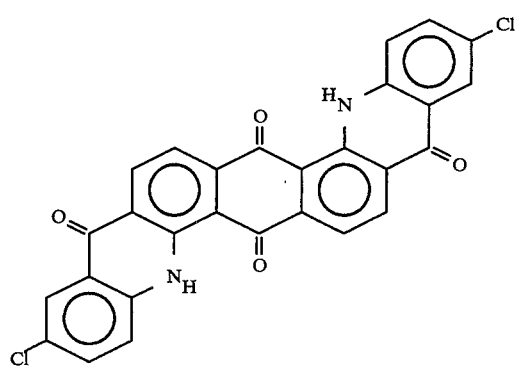
No. C-22
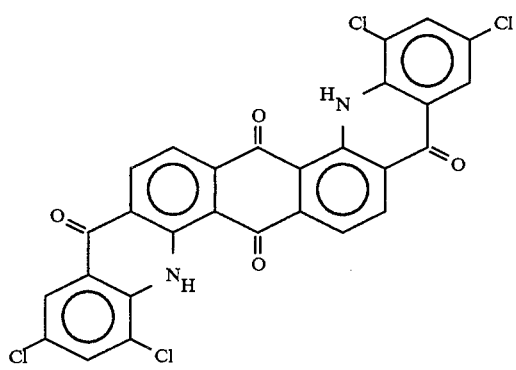
No. C-23
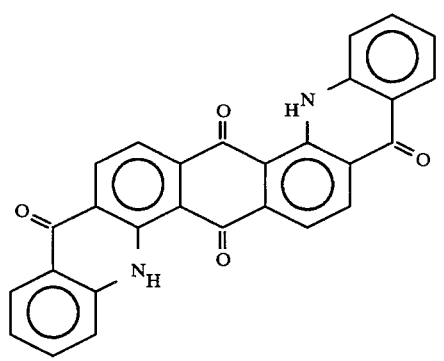
No. C-24

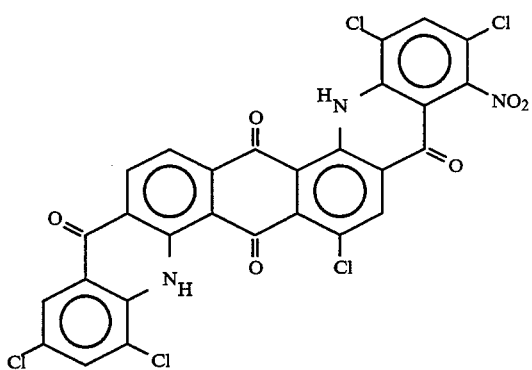
No. C-25
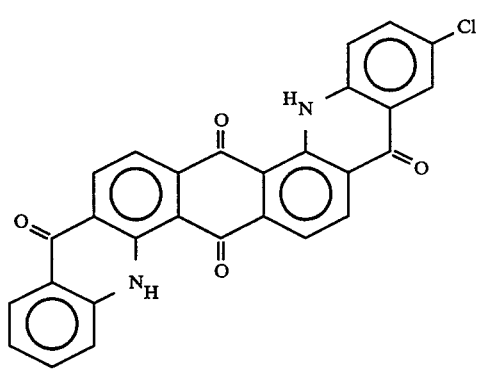
No. C-26
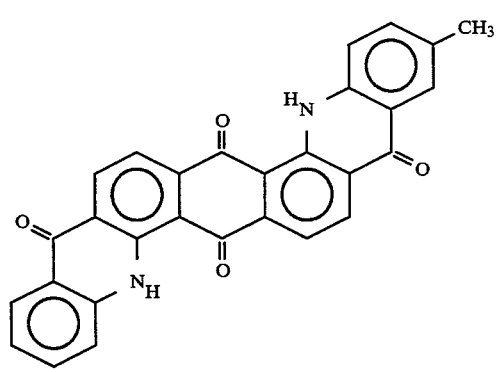
No. C-27
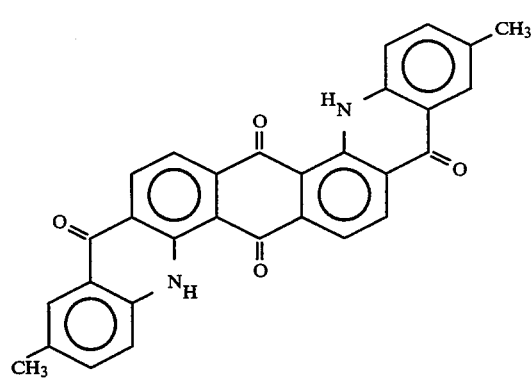
No. C-28

-continued
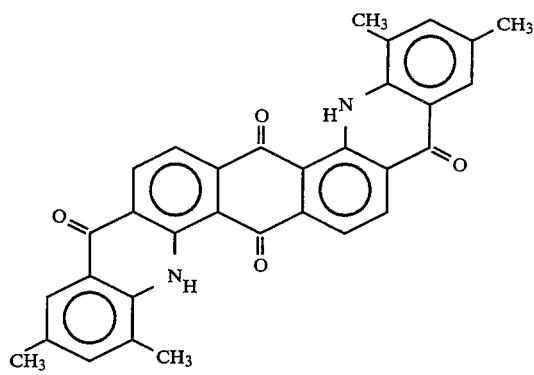
No. C-29
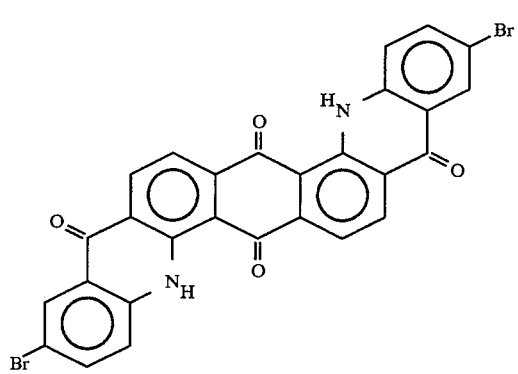
No. C-30
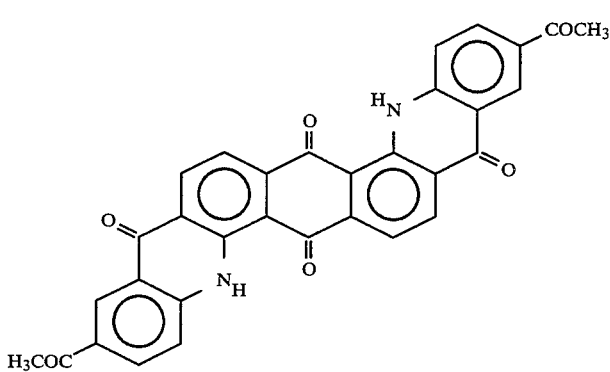
No. C-31
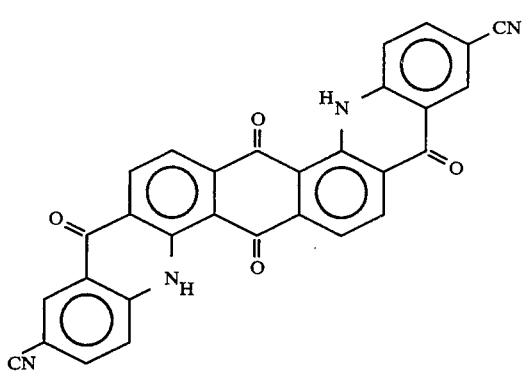
No. C-32

-continued
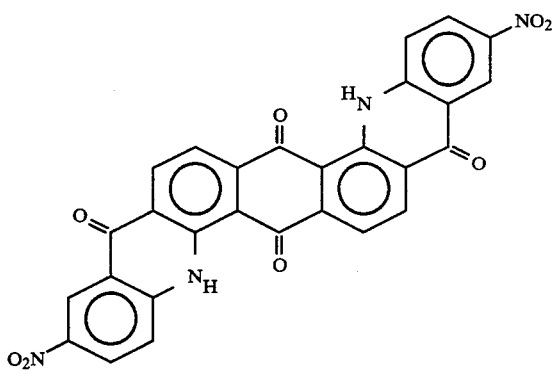
No. C-33
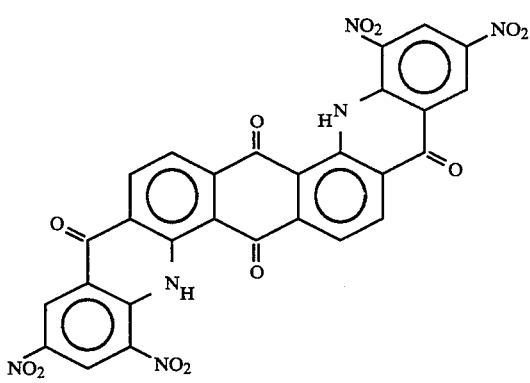
No. C-34
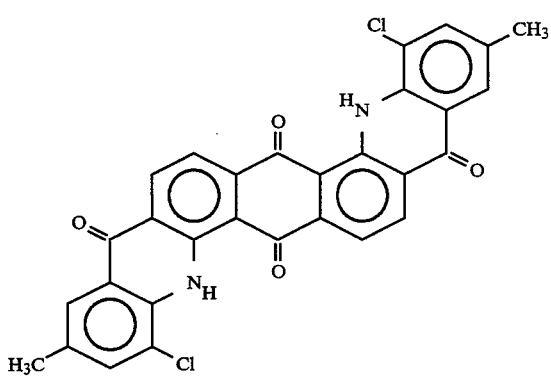
No. C-35
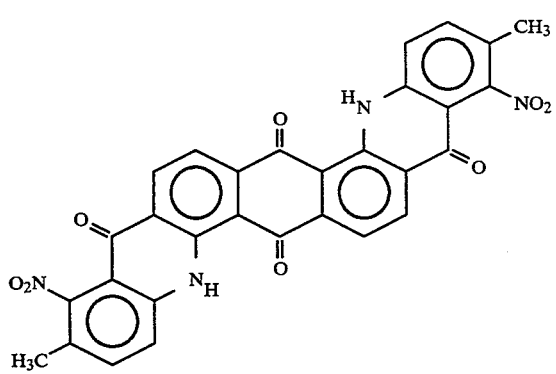
No. C-36

No. C-37

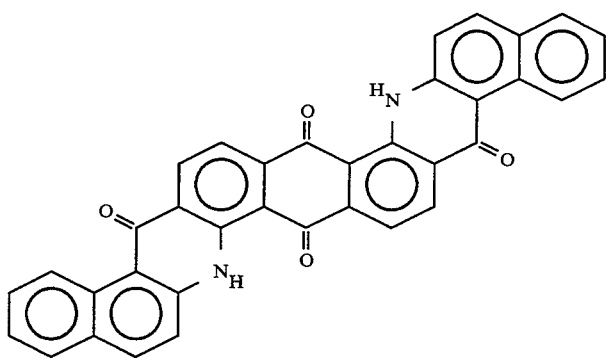

No. C-38

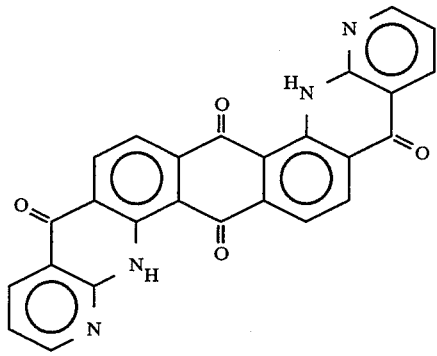

No. C-39

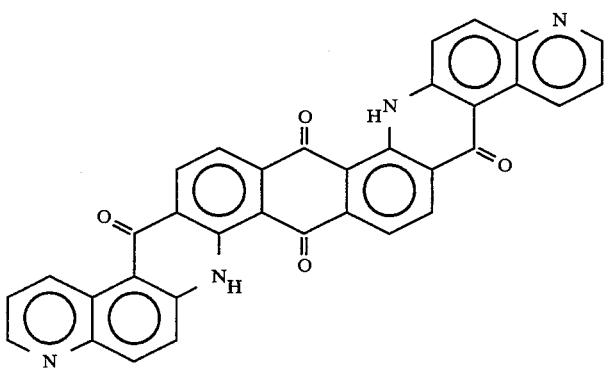

No. C-40

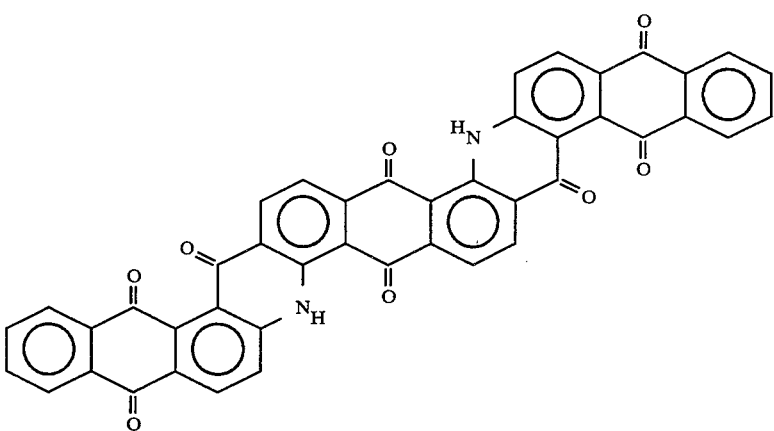

Examples of the polycyclic quinone pigment which is an effective material for the first electron acceptor organic layer EAOL(I) or for the second electron acceptor organic layer EAOL(II) are anthanthrone, dibenzpyrenequinone, pyranthrone, flavanthrone, violanthrone, and isoviolanthrone, each of which may have a substituent. Examples of the substituent are a halogen atom such as fluorine, chlorine, bromine and iodine; nitro group; and an alkyl group.

Specific examples of the polycyclic quinone pigment are as follows:

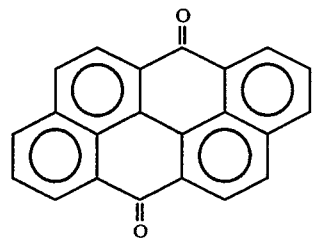 No. D-1
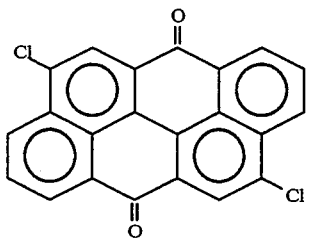 No. D-2
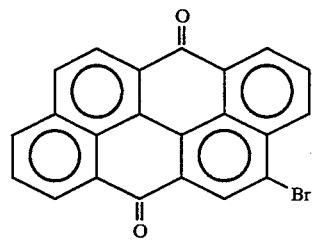 No. D-3
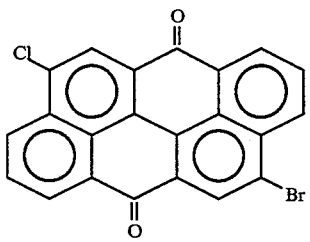 No. D-4
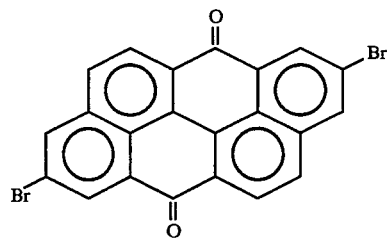 No. D-5
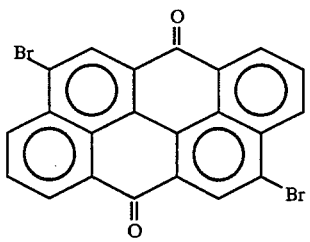 No. D-6
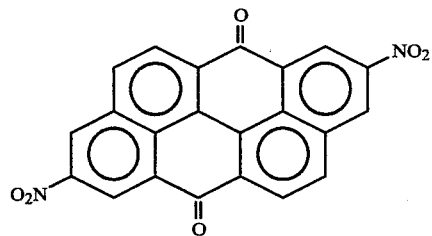 No. D-7
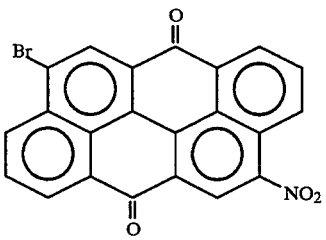 No. D-8
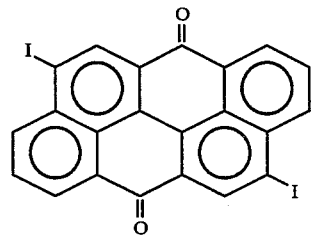 No. D-9
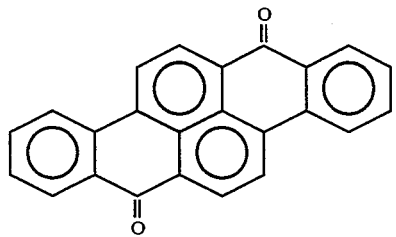 No. D-10
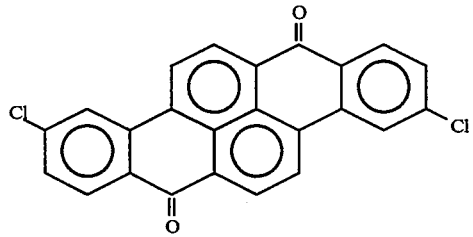 No. D-11
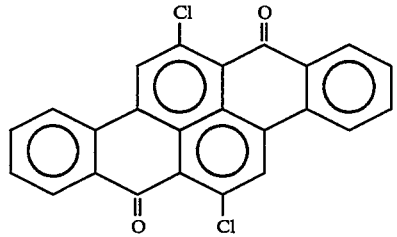 No. D-12
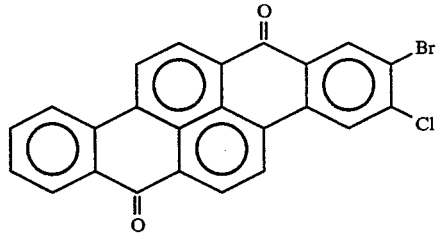 No. D-13
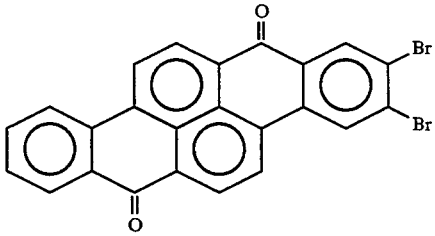 No. D-14

-continued
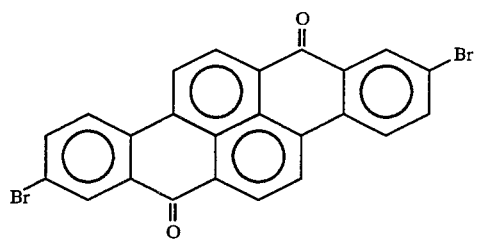 No. D-15
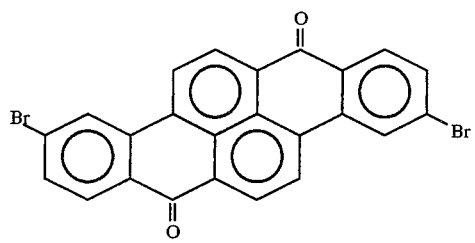 No. D-16
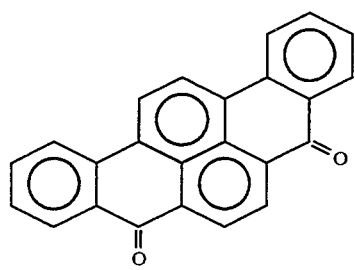 No. D-17
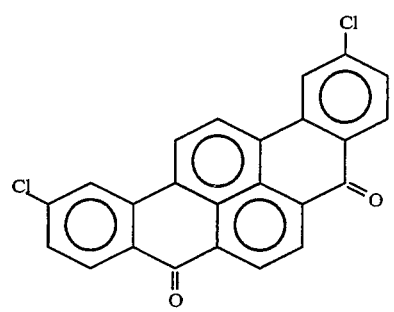 No. D-18
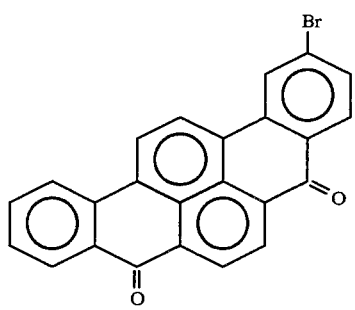 No. D-19
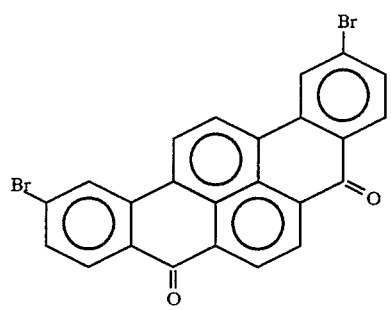 No. D-20
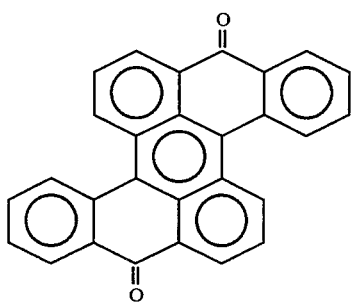 No. D-21
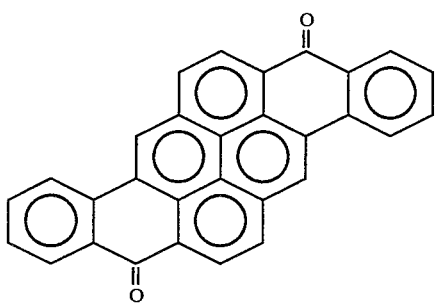 No. D-22
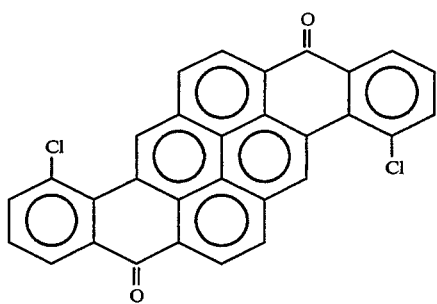 No. D-23
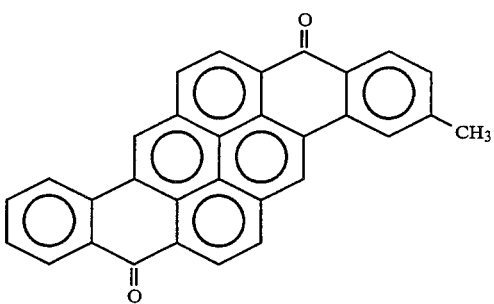 No. D-24

-continued
No. D-25
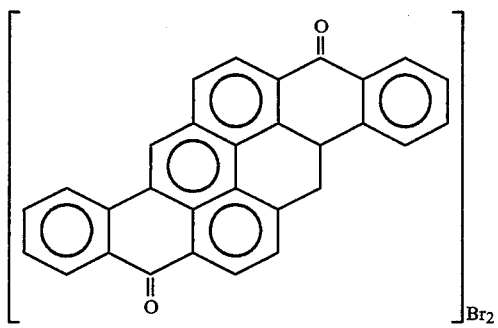
No. D-26
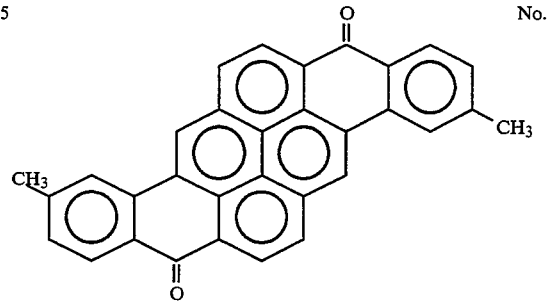
No. D-27
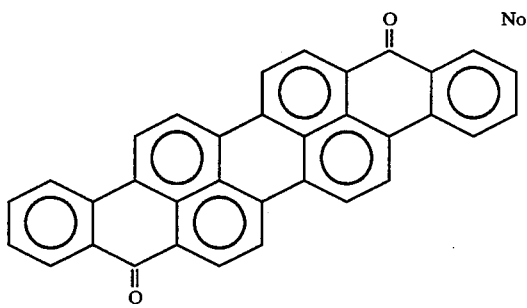
No. D-28
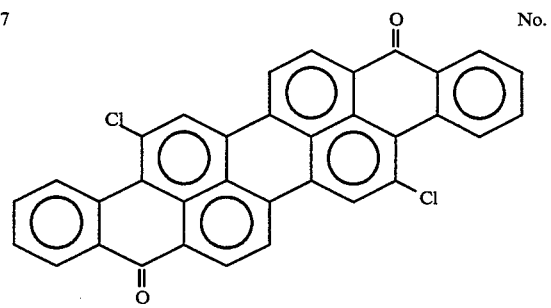
No. D-29
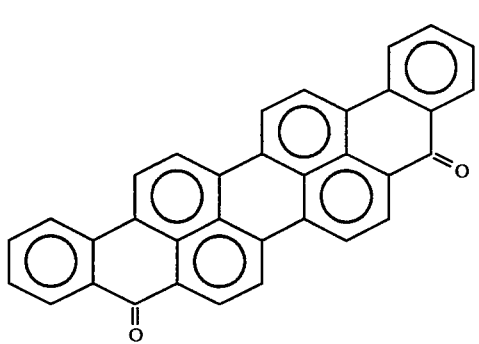
No. D-30
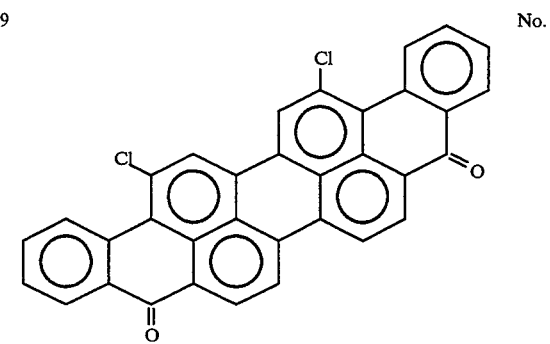
No. D-31
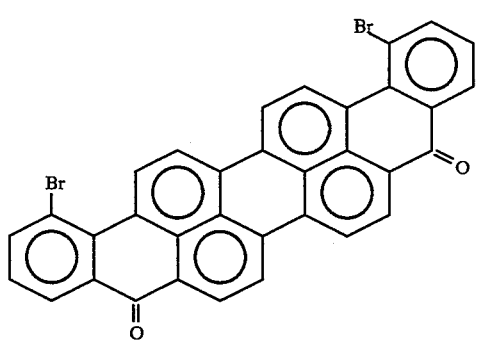
No. D-32
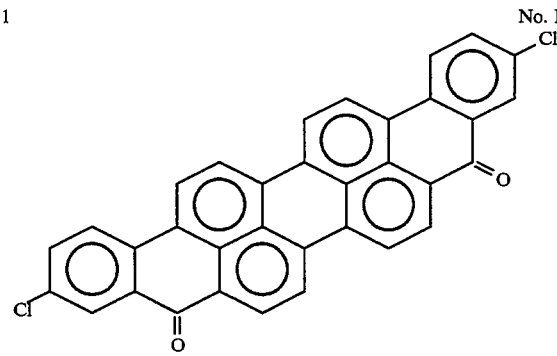
No. D-33
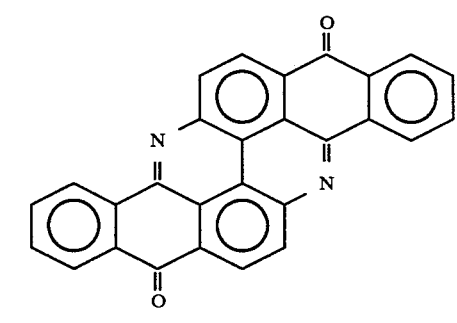
No. D-34
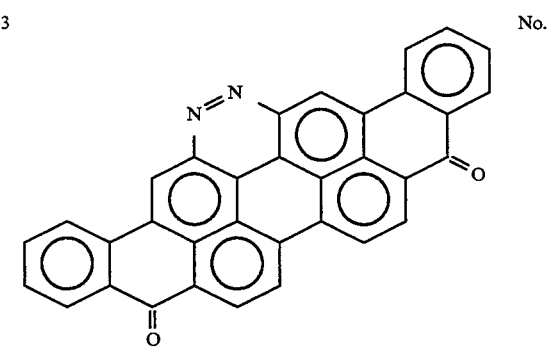

No. D-35
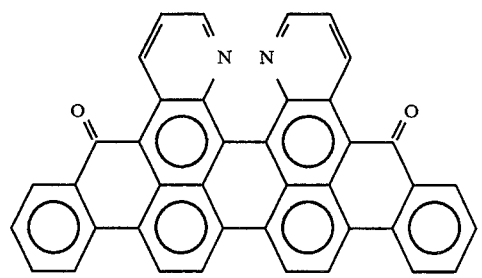
No. D-36
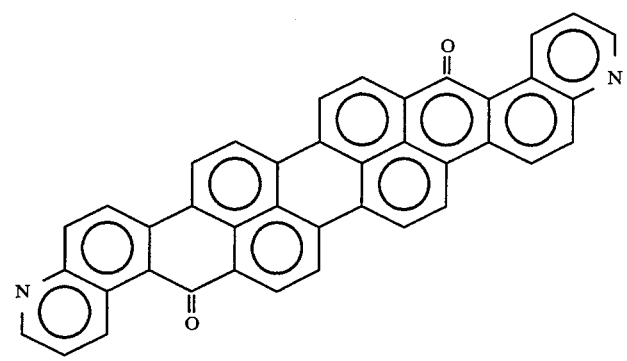
No. D-37
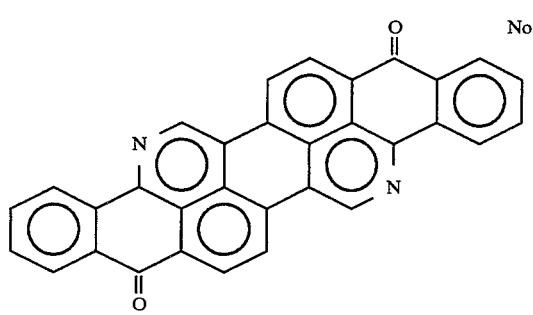
No. D-38
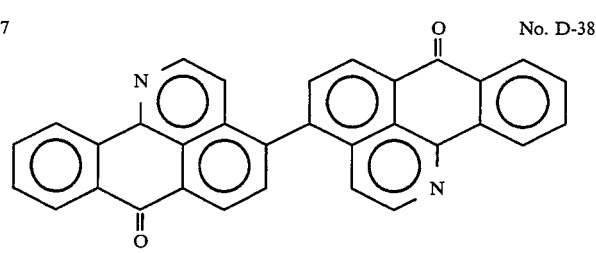
No. D-39
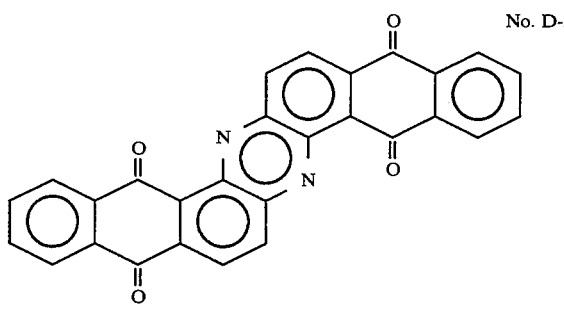
No. D-40
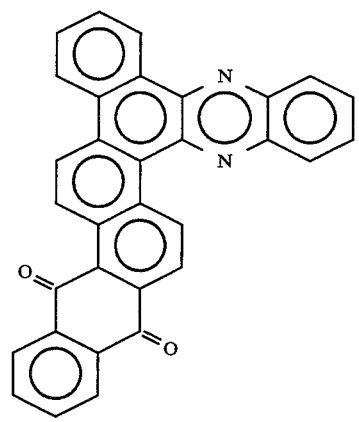
No. D-41
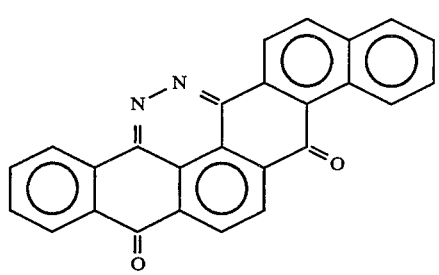
The naphthalene tetracarboxidiimidazole pigment which is an effective material for the first electron acwherein $X^6$, $X^7$, $X^8$ and $X^9$ each represent an unsubstituted or substituted aryl ring.

Specific examples of the naphthalene tetracarboxidiimidazole pigment are as follows:

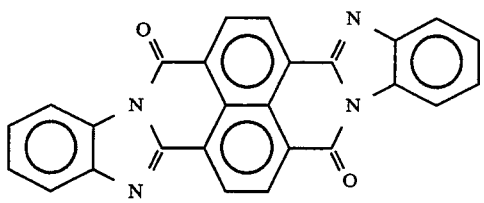
No. E-1

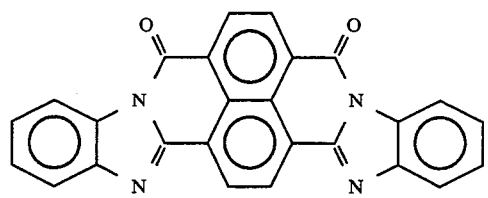
No. E-2

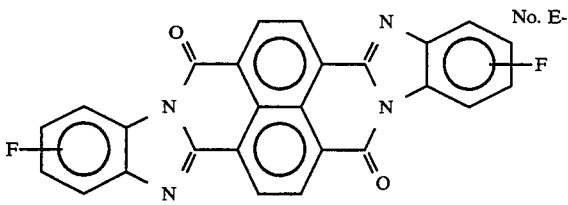
No. E-3

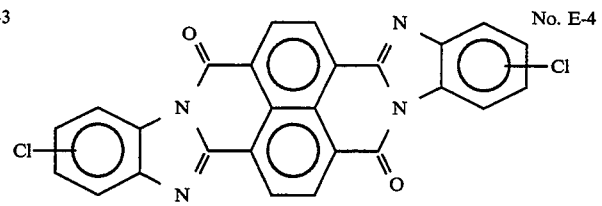
No. E-4

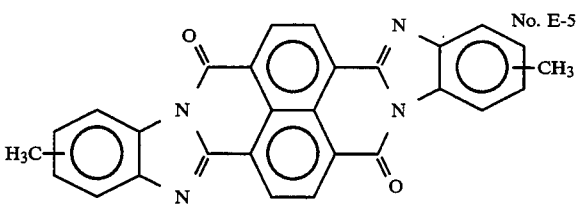
No. E-5

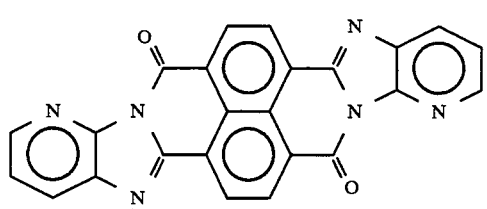
No. E-6

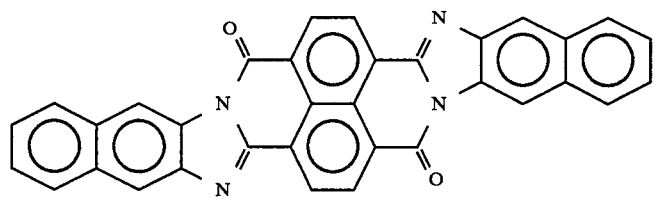
No. E-7

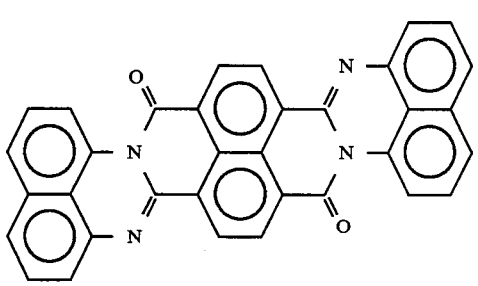
No. E-8

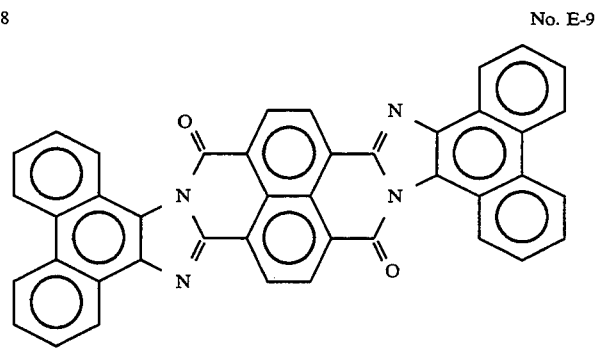
No. E-9

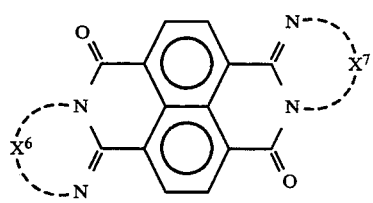

(6)

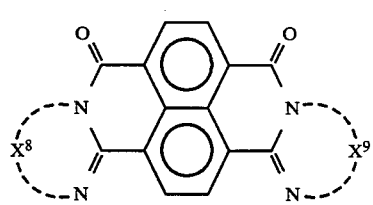

(7)

The above-mentioned perylene tetracarboxi-diimide pigment, perylene tetracarboxidiimidazole pigment, anthraquinone acridone pigment, polycyclic quinone pigment, and naphthalene tetracarboxidiimidazole pigment for the organic layers of the organic photovoltaic element according to the present invention can be prepared by conventionally known methods.

Examples of the phthalocyanine pigment which is an effective material for the first electron donor organic layer EDOL(I) or the second electron donor organic layer EDOL(II) for use in the present invention are metal-free phthalocyanine, copper phthalocyanine, zinc phthalocyanine, nickel phthalocyanine, platinum phthalocyanine, magnesium phthalocyanine, lead phthalocyanine, iron phthalocyanine, aluminum chlorophthalocyanine, indium chlorophthalocyanine, indium bromophthalocyanine, vanadyl phthalo-cyanine, titanyl phthalocyanine, chlorinated copper phthalocyanine, chlorinated zinc phthalocyanine, chlorinated aluminum chlorophthalocyanine; rare earth diphthalocyanine compounds such as scandium diphthalocyanine, yttrium diphthalocyanine, lanthanum diphthalocyanine, cerium diphthalocyanine, praseodymium phthalocyanine, neodymium diphthalocyanine, promethium diphthalocyanine, samarium diphthalocyanine, europium diphthalocyanine, gadolinium diphthalocyanine, terbium diphthalocyanine, dysprosium diphthalocyanine, holmium diphthalocyanine, erbium diphthalocyanine, thulium diphthalocyanine, ytterbium diphthalocyanine, and lutetium diphthalocyanine, and diphthalocyanines having as a center metal an actinoid element such as thorium or uranium.

Examples of the quinacridone compound which is an effective material for the first electron donor organic layer EDOL(I) or the second electron donor organic layer EDOL(II) for use in the present invention are unsubstituted quinacridone, 2,9-dichloroquinacridone, 3,10-dichloroquinacridone, 4,11-dichloroquinacridone, 3,4,10,11-tetrachloroquinaqcridone, 2,4,9,11-tetrachloroquinacridone, 1,2,8,9-tetrachloroquinacridone, 1,2,4,8,9,11-hexachloroquinacridone, 2,4,9,11-tetrabromoquinacridone, 2,3,9,10-tetrabromoquinacridone, 2,3,9,10-tetrabromoquinacridone, 1,4,8,11-tetrabromoquinacridone, 2,4,9,11-tetrafluoroquinacridone, 1,4,8,11-tetrafluoroquinacridone, 2,4,9,10-tetraiodoquinacridone, 2,9-dimethylquinacridone, 3,10-dimethylquinacridone, 4,11-dimethylquinacridone, 3,4,10,11-tetramethylquinacridone, 2,4,9,11-tetramethylquinacridone, 1,2,8,9-tetramethylquinacridone, 1,4,8,11-tetramethylquinacridone, 2,9-dimethoxyquinacridone, 3,10-dimethoxyquinacridone, 4,11-dimethoxyquinacridone, 2,4,9,11-tetrametoxyquinacridone, and 1,4,8,11-tetramethoxyquinacridone.

By use of the n-type inorganic semiconductor layer in the organic photovoltaic element of the present invention as mentioned previously with reference to FIG. 2, the $V_{oc}$, $J_{sc}$, and ff values can be increased, whereby the conversion efficiency can be improved and the occurrence of the short-circuit can be reduced. The reason why the above effects can be obtained by use of the n-type inorganic semiconductor layer has not yet been clarified. However, the reasons are considered to be as follows:

(1) Improvement of conversion efficiency (a) In a conventional organic photovoltaic element, a material with a low Fermi level such as ITO is usually employed as a material for a transparent electrode. Therefore when no n-type inorganic semiconductor layer is provided, a Schottky junction is formed between an electron acceptor organic layer and the transparent electrode in the organic photovoltaic element. This junction works as an energy barrier during the course of the transfer of electrons from the electron acceptor organic layer to the transparent electrode. On the other hand, when an n-type inorganic semiconductor layer is used in the organic photovoltaic element, the transparent electrode and the n-type inorganic semiconductor layer, which are in contact, form an ohmic junction, and the n-type inorganic semiconductor layer and the electron acceptor organic layer, which are in contact, also form an ohmic junction, so that the transfer of electrons can be smoothly carried out.

(b) The probability of the occurrence of short-circuits within the organic photovoltaic element can be reduced by the presence of the n-type inorganic semiconductor layer, so that the organic layers can be made thin, and the quantum efficiency of the photovoltaic element can be improved.

(c) Electrons are supplied from the n-type inorganic semiconductor layer to the electron acceptor organic layer in the dark, so that the intensity of the internal electric field generated at the interface between the electron acceptor organic layer and the electron donor organic layer can be increased.

(2) Reduction of the occurrence of short-circuits (a) By the presence of the n-type inorganic semiconductor layer, the difference in level in an edge portion of the transparent electrode can be reduced (i.e., the difference in level in the edge portion is usually about 1000 Å or more when ITO is used in the transparent electrode), so that the probability of the occurrence of short-circuits in that portion between the two electrodes can be reduced.

(b) Even when pin holes are present in the electron acceptor organic layer, the electron donor organic layer, which is in contact with the electron acceptor organic layer with the pin holes, forms a p-n junction in combination with the n-type inorganic semiconductor layer, so that the influence of the pin holes in the electron acceptor organic layer disappears. In the case where pin holes are present in the electron donor organic layer, the result is the same as mentioned above at the interface between the back electrode and the electron acceptor organic layer, so that the occurrence of short-circuit can be reduced.

(1) Transparent insulating support

Glass and plastic films can be employed as the materials for the transparent insulating support for use in the organic photovoltaic element according to the present invention.

(2) Transparent electrode

Indium tin oxide (ITO), tin oxide, and indium oxide can be employed as the materials for the transparent electrode for use in the organic photovoltaic element according to the present invention. It is preferable that the thickness of the transparent electrode be in the range of 100 Å to 10,000 Å.

(3) n-type semiconductor layer

Zinc oxide, trivalent-metal-doped zinc oxide, CdS, titanium oxide, and a phosphorus-doped amorphous silicon can be employed as the materials for the n-type semiconductor layer for use in the organic photovoltaic element according to the present invention. In particular, the above-mentioned zinc oxide and CdS can be preferably employed. It is preferable that the thickness of the n-type semiconductor layer be in the range of 10 Å to 10,000 Å.

(4) First and second electron acceptor organic layers EAOL(I) and EAOL(II)

In addition to the previously mentioned perylene tetracarboxidiimide pigment, perylene tetracarboxidiimidazole pigment, anthraquinone acridone pigment, polycyclic quinone pigment and naphthalene tetracarboxidiimidazole pigment, dyes such as Crystal Violet, Methyl Violet, and Malachite Green, and acceptor compounds such as 2,4,7-trinitrofluorenone, tetracyano-quinodimethane, tetracyanoethylene, and diphenoquinone can be employed for the first and second electron acceptor organic layers EAOL(I) and EAOL(II) for use in the organic photovoltaic element.

These electron acceptor layers can be formed by the vacuum deposition method, the spin coating method, or the dipping method.

The vacuum deposition method is preferable for obtaining uniformly thin electron acceptor organic layers.

It is preferable that the first electron acceptor organic layer EAOL(I) have a thickness in the range of 30 Å to 300 Å. This is because when the first electron acceptor organic layer EAOL(I) is thicker than 300 Å, there is the tendency that the $J_{sc}$ value does not increase any further, while when the first electron acceptor organic layer EAOL(I) is thinner than 30 Å, the light absorption of the first electron acceptor organic layer EAOL(I) itself decreases, so that the $J_{sc}$ value also decreases.

It is preferable that the second electron acceptor organic layer EAOL(II) have a thickness in the range of 50 Å to 3,000 Å.

(5) First and second electron donor organic layers EDOL(I) and EDOL(II)

In the addition to the previously mentioned phthalocyanine pigments and quinacridone pigments, the following materials can be employed for the first and second electron donor organic layers EDOL(I) and EDOL(II) for use in the organic photovoltaic element according to the present invention: indigo and thioindigo pigments such as Pigment Blue 66 and Pigments Violet 36; dyes such as merocyanine compounds, cyanine compounds, and squarylium compounds; charge transfer agents for use in an organic electrophotographic photoconductor such as hydrazone compound, pyrazoline compounds, triphenylmethane compounds, and triphenylamine compounds; conjugated electroconductive polymers such as polypyrrole, polyaniline, and polythiophene.

These electron donor organic layers can be formed by the vacuum deposition method, the spin coating method and the dipping method. The vacuum deposition method is preferable for obtaining uniformly thin electron donor organic layers.

It is preferable that the first electron donor organic layer EDOL(I) have a thickness in the range of 30 Å to 300 Å. This is because there is the tendency that when the first electron donor organic layer EDOL(I) is thicker than 300 Å, the $J_{sc}$ value does not increase, while when the first electron donor organic layer EDOL(I) is thinner than 30 Å, the light absorption of the first electron donor organic layer EDOL(I) itself decreases, so that the $J_{sc}$ value also decreases.

It is preferable that the second electron donor organic layer EDOL(II) have a thickness in the range of 50 Å to 3000 Å.

In the organic photovoltaic element according to the present invention, there are preferable combinations of the materials for the first electron acceptor organic layer EAOL(I) and the second electron acceptor organic layer EAOL(II), and preferable combinations of the materials for the first electron donor organic layer EDOL(I) and the second electron donor organic layer EDOL(II) from the viewpoint of the relationship between the respective absorption wavelength regions of these layers.

Examples of a preferable combination of a first electron acceptor organic material for the first electron acceptor organic layer EAOL(I) and a second electron acceptor organic material for the second electron acceptor organic layer EAOL(II) include perylene tetracarboxidiimide pigment (main spectral absorption band in a visible region (hereinafter the wavelength in the parentheses means the same): 450 to 600 nm)/naphthalene tetracarboxidiimidazole pigment (400 to 550 nm), perylene tetracarboxidiimide pigment/flavanthrone (400 to 550 nm), perylene tetracarboxidiimide pigment/bromoanthanthrone (450 to 550 nm), perylene tetracarboxidiimide pigment/bioanthrone (500 to 700 nm), perylene tetracarboxidiimide pigment/isobioanthrone (500 to 700 nm), perylene tetracarboxidiimide pigment/perylene tetracarboxidiimidazole pigment (450 to 800 nm), perylene tetracarboxidiimide pigment/acceptor compound, naphthalene tetracarboxidiimidazole pigment/acceptor compound, Crystal Violet (500 to 650 nm)/perylene tetracarboxidiimide pigment, anthraquinone acridone pigment (450 to 700 nm)/perylene tetracarboxidiimide pigment, and anthraquinone acridone pigment/acceptor compound.

Examples of a preferable combination of a first electron donor organic material for the first electron donor organic layer EDOL(I) and a second electron donor organic material for the second electron donor organic layer EDOL(II) include phthalocyanine pigment (550 to 850 nm)/quinacridone pigment (450 to 600 nm), aluminum chlorophthalocyanine (650 to 850 m)/copper phthalocyanine (550 to 700 nm), aluminum chloro phthalocyanine/metal-free phthalocyanine (550 to 700 nm), indium chloro phthalocyanine (650 to 850 nm)/copper phthalocyanine, indium chloro phthalocyanine/metal-free phthalocyanine, cyanine compound (500 to 800 nm)/quinacridone pigment, squarylium compound (550 to 800 nm)/quinacridone pigment, phthalocyanine pigment/charge transfer agent (400 to 500 nm), phthalocyanine pigment/electron donor compound (400 to 500 nm), phthalocyanine pigment/electron donor compound (400 to 500 nm), phthalocyanine pigment/electroconductive polymer (400 to 550 nm), quinacridone pigment/charge transfer agent, and quinacridone pigment/indigo (500 to 700 nm).

In the organic photovoltaic element according to the present invention, preferable combinations of the first electron donor organic material for the first electron donor organic layer EDOL(I) and the second electron donor organic material for the second electron donor organic layer EDOL(II) are present from the viewpoint of the relationship between the respective values of ionization potential (Ip) of these layers. All these combinations have not yet been clarified. However, for instance, the following combinations of the first electron donor organic material and the second electron donor organic material are preferable: phthalocyanine pigment/quinacridones such as alumichlorophthalocyanine/quinacridone, alumichlorophthalocyanine/2,7-dimethyl quinacridone, metal-free phthalocyanine/quinacridone, copper phthalocyanine/2,7-dimethyl quinacridone, indium chlorophthalocyanine/quinacridone, and oxythitanyl phthalocyanine/quinacridone; phthalocyanine pigment/phthalocyanine pigments such as alumichlorophthalocyanine/metal-free phthalocyanine, alumichloro phthalocyanine/copper phthalocyanine, indium chloro phthalocyanine/metal-free phthalocyanine, and oxythitanyl phthalocyanine/copper phthalocyanine; phthalocyanine pigment/conjugated electroconductive polymers such as alumichloro phthalocyanine/polypyrrole, metal-free phthalocyanine/polyaniline, and copper phthalocyanine/polythiophene.

In the organic photovoltaic element according to the present invention, the preferable combinations of the first electron acceptor organic material for the first electron acceptor organic layer EAOL(I) and the second electron acceptor organic material for the second electron acceptor organic layer EAOL(II) are present from the viewpoint of the respective electron affinities (Ea) of these layers. All these combinations have not yet been clarified. However, for instance, the following combinations of the first electron acceptor organic material and second electron acceptor organic material are preferable: perylene tetracarboxidiimide pigment/perylene tetracarboxidiimidazole pigment, perylene tetracarboxidi-imidazole pigment/perylene tetracarboxidiimide pigment, perylene tetracarboxidiimide pigment/flavanthrone, perylene tetracarboxidiimide pigment/bromoanthanthrone, perylene tetracarboxidiimide pigment/anthraquinone acridone pigment, and perylene tetracarboxidiimide pigment/naphthalene tetracarboxidiimidazole pigment.

(6) Back electrode

Metals with a high work function such as Au, Pt, Ni, Pd, Cu, Cr, and Ag can be employed as the materials for the back electrode for use in the organic photovoltaic element according to the present invention. Au is preferable for use in the present invention because of its high stability. It is preferable that the thickness of the back electrode be in the range of 50 Å to 3,000 Å.

Other features of this invention will become apparent in the course of the following description of exemplary embodiments, which are given for illustration of the invention and are not intended to be limiting thereof.

EXAMPLE 1

On a clean ITO glass with a resistivity of 30 Ω/□ (made by Matsuzaki Shinku Co., Ltd.) serving as a substrate, zinc oxide was deposited with a thickness of about 1500 Å, with the temperature of the substrate set at about 25° C., by the RF magnetron sputtering method, using argon as an introduction gas.

On the thus deposited zinc oxide layer, a perylene tetracarboxidimethylimide pigment (Compound No. A-2) serving as a first electron acceptor organic material was deposited in vacuum with a thickness of about 460 Å.

On the thus deposited perylene tetracarboxidimethylimide pigment layer, a perylene tetracarboxidiimidazole pigment (Compound No. B-1) serving as a second electron acceptor organic material was deposited in vacuum with a thickness of about 150 Å, and then aluminum chlorophthalocyanine (AlClPc) serving as a first electron donor organic material was deposited in vacuum with a thickness of about 160 Å on the perylene tetracarboxidiimidazole pigment layer. Furthermore, 2,7-dimethylquinacridone (QA-ME) serving as a second electron donor organic material was deposited in vacuum with a thickness of about 440 Å on the AlClPc layer.

Finally, gold was deposited in vacuum on the QA-ME layer in such a manner that the area in which the deposited gold and the ITO faced each other through the above-mentioned layers therebetween was 0.25 cm². The gold and the ITO serving as electrodes were connected through a lead wire by use of a silver paste, whereby organic photovoltaic element No. 1 according to the present invention was fabricated.

As the ITO side of the thus fabricated organic photovoltaic element No. 1 of the present invention was irradiated with a white light of 75 mW/cm², a sweep voltage of 6 mV/s was applied thereto, so that the conversion efficiency of the organic photovoltaic element No. 1 was measured. The result was that the conversion efficiency was 0.622%, with $V_{oc}=0.51$ V, $J_{sc}=2.12$ mA/cm², and ff=0.43. This conversion efficiency was excellent for this type of organic photovoltaic element.

COMPARATIVE EXAMPLE 1

The procedure for fabrication of organic photovoltaic element No. 1 in Example 1 was repeated except that the perylene tetracarboxidimethylimide pigment (Compound No. A-2) serving as the first electron acceptor organic material was omitted, the thickness of the perylene tetracarboxidiimidazole pigment (Compound No. B-1) layer serving as the second electron acceptor organic layer was changed from about 150 Å to about 350 Å, the thickness of the AlClPc layer serving as the first electron donor organic layer was changed from about 160 Å to 380 Å, and the QA-ME layer serving as the second electron donor organic layer was omitted, whereby comparative organic photovoltaic element No. 1 was fabricated.

As the ITO side of the thus fabricated comparative organic photovoltaic element No. 1 was irradiated with a white light of 75 mW/cm², a sweep voltage of 6 mV/s was applied thereto, so that the conversion efficiency of comparative organic photovoltaic element No. 1 was measured. The result was that the conversion efficiency was 0.196%, with $V_{oc}=0.37$ V, $J_{sc}=1.21$ mA/cm², and ff=0.33. This conversion efficiency was much lower than that of organic photovoltaic element No. 1 of the present invention.

EXAMPLE 2

The procedure for fabrication of organic photovoltaic element No. 1 in Example 1 was repeated except that the thickness of the perylene tetracarboxidimethylimide pigment (Compound No. A-2) layer serving as the first electron acceptor organic layer employed in Example 1 was changed from about 460 Å to about 380 Å, the perylene tetracarboxidiimidazole pigment (Compound No. B-1) layer serving as the second electron acceptor organic layer was replaced by an anthraquinone acridone pigment (Compound No. C-21) layer with a thickness of about 150 Å, and the thickness of the AlClPc layer serving as the first electron donor organic layer was changed from about 160 Å to 140 Å, whereby organic photovoltaic element No. 2 of the present invention was fabricated.

As the ITO side of the thus fabricated organic photovoltaic element No. 2 of the present invention was irradiated with a white light of 75 mW/cm², a sweep voltage of 6 mV/s was applied thereto, so that the conversion efficiency of organic photovoltaic element No. 2 of the present invention was measured. The result was that the conversion efficiency was 0.240%, with $V_{oc}=0.36$ V, $J_{sc}=1.21$ mA/cm², and ff=0.42. This conversion efficiency was excellent for this type of organic photovoltaic element.

COMPARATIVE EXAMPLE 2

The procedure for fabrication of organic photovoltaic element No. 2 in Example 2 was repeated except that the perylene tetracarboxidimethylimide pigment (Compound No. A-2) serving as the first electron acceptor organic material employed in Example 2 was omitted, the thickness of the anthraquinone acridone pigment (Compound No. C-21) layer serving as the second electron acceptor organic layer was changed from about 150 Å to about 370 Å, the thickness of the AlClPc layer serving as the first electron donor organic layer was changed from 140 Å to 410 Å, and the QA-ME layer serving as the second electron donor organic layer was omitted, whereby comparative organic photovoltaic element No. 2 was fabricated.

As the ITO side of the thus fabricated comparative organic photovoltaic element No. 2 was irradiated with a white light of 75 mW/cm$^2$, a sweep voltage of 6 mV/s was applied thereto, so that the conversion efficiency of comparative organic photovoltaic element No. 2 was measured. The result was that the conversion efficiency was 0.090%, with $V_{oc}$=0.24 V, $J_{sc}$=1.730 mA/cm$^2$, and ff=0.39. This conversion efficiency was much lower than that of organic photovoltaic element No. 2 of the present invention.

EXAMPLE 3

The procedure for fabrication of organic photovoltaic element No. 1 in Example 1 was repeated except that the thickness of the perylene tetracarboxidimethylimide pigment (Compound No. A-2) layer serving as the first electron acceptor organic layer employed in Example 1 was changed from about 460 Å to about 390 Å, the perylene tetracarboxidiimidazole pigment (Compound No. B-1) layer with a thickness of about 150 Å serving as the second electron acceptor organic layer was replaced by a flavanthrone (Compound No. D-33) layer with a thickness of about 140 Å, the thickness of the AlClPc layer serving as the first electron donor organic layer was changed from about 160 Å to 190 Å, and the thickness of the QA-ME layer serving as the second electron donor organic layer was changed from about 440 Å to 520 Å, whereby organic photovoltaic element No. 3 of the present invention was fabricated.

As the ITO side of the thus fabricated organic photovoltaic element No. 3 of the present invention was irradiated with a white light of 75 mW/cm$^2$, a sweep voltage of 6 mV/s was applied thereto, so that the conversion efficiency of organic photovoltaic element No. 3 of the present invention was measured. The conversion efficiency was 0.581%, with $V_{oc}$=0.47 V, $J_{sc}$=1.92 mA/cm$^2$, and ff=0.48. This conversion efficiency was excellent for this type of organic photovoltaic element.

COMPARATIVE EXAMPLE 3

The procedure for fabrication of organic photovoltaic element No. 3 in Example 3 was repeated except that the perylene tetracarboxidimethylimide pigment (Compound No. A-2) serving as the first electron acceptor organic compound employed in Example 3 was omitted, the thickness of the flavanthrone (Compound No. D-33) layer serving as the second electron acceptor organic layer was changed from about 140 Å to about 310 Å, the thickness of the AlClPc layer serving as the first electron donor organic layer was changed from about 190 Å to 390 Å, and the QA-ME layer serving as the second electron donor organic layer was omitted, whereby comparative organic photovoltaic element No. 3 was fabricated.

As the ITO side of the thus fabricated comparative organic photovoltaic element No. 3 was irradiated with a white light of 75 mW/cm$^2$, a sweep voltage of 6 mV/s was applied thereto, so that the conversion efficiency of comparative organic photovoltaic element No. 3 was measured. The result was that the conversion efficiency was 0.213%, with $V_{oc}$=0.43 V, $J_{sc}$=842 mA/cm$^2$, and ff=0.44. This conversion efficiency was much lower than that of organic photovoltaic element No. 3 of the present invention.

EXAMPLE 4

The procedure for fabrication of organic photovoltaic element No. 1 in Example 1 was repeated except that the thickness of the perylene tetracarboxidimethylimide pigment (Compound No. A-2) layer serving as the first electron acceptor organic layer employed in Example 1 was changed from about 460 Å to about 370 Å, the perylene tetracarboxidiimidazole pigment (Compound No. B-1) layer with a thickness of about 150 Å serving as the second electron acceptor organic layer was replaced by a bromoanthanthrone (Compound No. D-5) layer with a thickness of about 110 Å, the thickness of the AlClPc layer was set at 160 Å, and the thickness of the QA-ME layer serving as the second electron donor organic layer was changed from about 440 Å to 480 Å, whereby organic photovoltaic element No. 4 of the present invention was fabricated.

As the ITO side of the thus fabricated organic photovoltaic element No. 4 of the present invention was irradiated with a white light of 75 mW/cm$^2$, a sweep voltage of 6 mV/s was applied thereto, so that the conversion efficiency of organic photovoltaic element No. 4 of the present invention was measured. The result was that the conversion efficiency was 0.629%, with $V_{oc}$=0.51 V, $J_{sc}$2.00 mA/cm$^2$, and ff=0.46. This conversion efficiency was excellent for this type of organic photovoltaic element.

COMPARATIVE EXAMPLE 4

The procedure for fabrication of organic photovoltaic element No. 4 in Example 4 was repeated except that the perylene tetracarboxidimethylimide pigment (Compound No. A-2) serving as the first electron acceptor organic compound employed in Example 4 was omitted, the thickness of the bromoanthanthrone (Compound No. D-5) layer serving as the second electron acceptor organic layer was changed from about 110 Å to about 220 Å, the thickness of the AlClPc layer serving as the first electron donor organic layer was changed from 160 Å to 430 Å, and the QA-ME layer serving as the second electron donor organic layer was omitted, whereby comparative organic photovoltaic element No. 4 was fabricated.

As the ITO side of the thus fabricated comparative organic photovoltaic element No. 4 was irradiated with a white light of 75 mW/cm$^2$, a sweep voltage of 6 mV/s was applied thereto, so that the conversion efficiency of comparative organic photovoltaic element No. 4 was measured. The result was that the conversion efficiency was 0.109%, with $V_{oc}$=0.26 V, $J_{sc}$=0.850 mA/cm$^2$, and ff=0.36. This conversion efficiency was much lower than that of organic photovoltaic element No. 4 of the present invention.

EXAMPLE 5

The procedure for fabrication of organic photovoltaic element No. 1 in Example 1 was repeated except that the thickness of the perylene tetracarboxidimethylimide pigment (Compound No. A-2) layer serving as the first electron acceptor organic layer employed in Example 1 was changed from about 460 Å to about 340 Å, the perylene tetracarboxidiimidazole pigment (Compound No. B-1) layer serving as the second electron acceptor organic layer employed in Example 1 was replaced by a naphthalene tetracarboxidiimidazole (Compound No.

E-1) layer with a thickness of about 150 Å, and the thickness of the QA-ME layer serving as the first electron donor organic layer was changed from about 440 Å to 480 Å, whereby organic photovoltaic element No. 5 of the present invention was fabricated.

As the ITO side of the thus fabricated organic photovoltaic element No. 5 of the present invention was irradiated with a white light of 75 mW/cm$^2$, a sweep voltage of 6 mV/s was applied thereto, so that the conversion efficiency of organic photovoltaic element No. 5 of the present invention was measured. The result was that the conversion efficiency was 0.396%, with $V_{oc}=0.53$ V, $J_{sc}=1.40$ mA/cm$^2$, and ff=0.40. This conversion efficiency was excellent for this type of organic photovoltaic element.

COMPARATIVE EXAMPLE 5

The procedure for fabrication of organic photovoltaic element No. 5 in Example 5 was repeated except that the perylene tetracarboxidimethylimide pigment (Compound No. A-2) serving as the first electron acceptor organic compound employed in Example 5 was omitted, the thickness of the naphthalene tetracarboxidiimidazole pigment (Compound No. E-1) layer serving as the second electron acceptor organic layer was changed from about 150 Å to about 360 Å, the thickness of the AlClPc layer serving as the first electron donor organic layer was changed from about 160 Å to 480 Å, and the QA-ME layer serving as the second electron donor organic layer was omitted, whereby comparative organic photovoltaic element No. 5 was fabricated.

As the ITO side of the thus fabricated comparative organic photovoltaic element No. 5 was irradiated with a white light of 75 mW/cm$^2$, a sweep voltage of 6 mV/s was applied thereto, so that the conversion efficiency of comparative organic photovoltaic element No. 5 was measured. The result was that the conversion efficiency was 0.155%, with $V_{oc}=0.43$ V, $J_{sc}=0.849$ mA/cm$^2$, and ff=0.32. This conversion efficiency was much lower than that of organic photovoltaic element No. 5 of the present invention.

From the above obtained results, the effects of the organic photovoltaic element according to the present invention are as follows:

(1) The photovoltaic element of the present invention comprises a first electron acceptor organic layer EAOL(I), a second acceptor organic layer EAOL(II), a first electron donor organic layer EDOL(I), and a second electron donor organic layer EDOL(II), which are overlaid on an electrode in that order, and because of this element structure, high conversion efficiency can be provided together with high $V_{oc}$, $J_{sc}$, and ff values.

(2) In the photovoltaic element having the particular structure mentioned in (1) according to the present invention, it is preferable that the first electron acceptor organic layer EAOL(I) or the second electron donor organic layer EDOL(II) have a principal light absorption wavelength region which is different from the principal light absorption wavelength region of the second acceptor organic layer EAOL(II) or that of the first electron donor organic layer EDOL(I) to obtain the above effect.

(3) In the photovoltaic element having the particular structure mentioned in (1) according to the present invention, it is preferable that the Ip of the second electron donor organic layer EDOL(II) be equal to or less than that of the first electron donor organic layer EDOL(I).

(4) In the photovoltaic element having the particular structure mentioned in (1) according to the present invention, it is preferable that the electron affinity (Ea) of the first electron acceptor organic layer EAOL(I) be equal to or greater than that of the second electron acceptor organic layer EAOL(II).

(5) In the photovoltaic element having the particular structure mentioned in (1) according to the present invention, it is preferable that the perylene tetracarboxidiimide pigment, perylene tetracarboxidiimidazole pigment, polycyclic quinone pigment, anthraquinone acridone pigment, or naphthalene tetracarboxidiimidazole pigment be employed as the material for the first electron acceptor organic layer EAOL(I) or for the second electron acceptor organic layer EAOL(II).

(6) In the photovoltaic element having the particular structure mentioned in (1) according to the present invention, it is preferable that phthalocyanine pigment or quinacridone pigment be employed as the material for the first electron donor organic layer EDOL(I) or for the second electron donor organic layer EDOL(II).

What is claimed is:

1. An organic photovoltaic element comprising:
   a first electrode,
   a first electron acceptor organic layer provided on said first electrode,
   a second electron acceptor organic layer which is different from said first electron acceptor organic layer, provided on said first electron acceptor organic layer,
   a first electron donor organic layer provided on said second electron acceptor organic layer,
   a second electron acceptor organic layer which is different from said first electron acceptor organic layer, provided on said first electron acceptor organic layer, and
   a second electrode provided on said second electron acceptor organic layer, at least one of said first electrode or said second electrode being transparent.

2. The organic photovoltaic element as claimed in claim 1, wherein said first electron acceptor organic layer or said second electron donor organic layer has a principal light absorption wavelength region which is different from the principal light absorption wavelength region of said second electron acceptor organic layer or that of said first electron donor organic layer.

3. The organic photovoltaic element as claimed in claim 1 or claim 2, wherein said second electron donor organic layer has an ionization potential which is equal to or less than the ionization potential of said first electron donor organic layer.

4. The organic photovoltaic element as claimed in claim 1, wherein said first electron acceptor organic layer has an electron affinity which is equal to or greater than that of said second electron acceptor organic layer.

5. The organic photovoltaic element as claimed in claim 1, wherein said first electron acceptor organic layer or said second electron acceptor organic layer comprises a pigment selected from the group consisting of a perylene tetracarboxidiimide pigment, a perylene tetracarboxidiimidazole pigment, an anthraquinone acridone pigment, a polycyclic quinone pigment, and a naphthalene tetracarboxidiimidazole pigment.

6. The organic photovoltaic element as claimed in claim 1, wherein said first electron donor organic layer or said second electron donor organic layer comprises a phthalocyanine pigment or a quinacridone pigment.

* * * * *

UNITED STATES PATENT AND TRADEMARK OFFICE
CERTIFICATE OF CORRECTION

PATENT NO. : 5,350,459

DATED : September 27, 1994

INVENTOR(S) : Tetsuro SUZUKI, et al.

It is certified that error appears in the above-identified patent and that said Letters Patent is hereby corrected as shown below:

Column 3, line 44, "short-circuits circuits" should read
--short-circuits--.

Column 7, line 5, "(c) Electrone generated" should read
--(c) Electrons generated--.

line 34, "a primcipal light" should read
--a principal light--.

Column 15, line 18, "wherein $X^3$, $X^4$ and $X^3$ each" should read
--wherein $X^3$, $X^4$ and $X^5$ each--.

UNITED STATES PATENT AND TRADEMARK OFFICE
CERTIFICATE OF CORRECTION

PATENT NO. : 5,350,459
DATED : September 27, 1994
INVENTOR(S) : Tetsuro SUZUKI, et al.

It is certified that error appears in the above-identified patent and that said Letters Patent is hereby corrected as shown below:

Column 35, lines 67-68, "The naphthalene tetracarboxidiimidazole pigment which is an effective material for the first electron ac-" should read -- The naphthalene tetracarboxidiimidazole pigment which is an effective material for the first electron acceptor organic layer EAOL(I) or for the second electron acceptor organic layer EAOL(II) for use in the present invention is represented by the following formula (6) and (7):

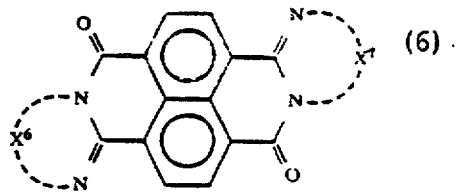

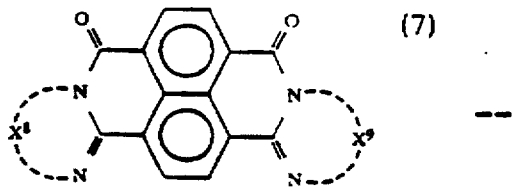

--.

UNITED STATES PATENT AND TRADEMARK OFFICE
CERTIFICATE OF CORRECTION

PATENT NO.    : 5,350,459
DATED         : September 27, 1994
INVENTOR(S)   : Tetsuro SUZUKI, et al.

It is certified that error appears in the above-identified patent and that said Letters Patent is hereby corrected as shown below:

Column 37, lines 52-67 (formulas 6 and 7), delete in their entirety.

Signed and Sealed this

Twelfth Day of September, 1995

Attest:

BRUCE LEHMAN

Attesting Officer    Commissioner of Patents and Trademarks